United States Patent
Takagi et al.

(10) Patent No.: US 8,295,123 B2
(45) Date of Patent: Oct. 23, 2012

(54) CURRENT RECTIFYING ELEMENT, MEMORY DEVICE INCORPORATING CURRENT RECTIFYING ELEMENT, AND FABRICATION METHOD THEREOF

(75) Inventors: Takeshi Takagi, Kyoto (JP); Takumi Mikawa, Shiga (JP); Koji Arita, Osaka (JP); Mitsuteru Iijima, Osaka (JP); Takashi Okada, Osaka (JP)

(73) Assignee: Panasonic Corporation, Osaka (JP)

( * ) Notice: Subject to any disclaimer, the term of this patent is extended or adjusted under 35 U.S.C. 154(b) by 230 days.

(21) Appl. No.: 12/669,174

(22) PCT Filed: Jul. 11, 2008

(86) PCT No.: PCT/JP2008/001867
§ 371 (c)(1),
(2), (4) Date: Jan. 14, 2010

(87) PCT Pub. No.: WO2009/011113
PCT Pub. Date: Jan. 22, 2009

(65) Prior Publication Data
US 2010/0193760 A1   Aug. 5, 2010

(30) Foreign Application Priority Data
Jul. 18, 2007 (JP) .................................. 2007-186622

(51) Int. Cl.
*G11C 13/00* (2006.01)
(52) U.S. Cl. ........................................ 365/242; 257/288
(58) Field of Classification Search .................. None
See application file for complete search history.

(56) References Cited

U.S. PATENT DOCUMENTS

| | | | |
|---|---|---|---|
| 3,702,956 A * | 11/1972 | Renard et al. ................... 257/32 |
| 4,741,601 A | 5/1988 | Saito |
| 5,019,530 A | 5/1991 | Kleinsasser et al. |
| 5,049,970 A * | 9/1991 | Tanaka et al. ................ 257/380 |
| 6,121,654 A * | 9/2000 | Likharev ....................... 257/315 |
| 6,753,561 B1 | 6/2004 | Rinerson et al. |
| 2002/0145902 A1* | 10/2002 | Kunikiyo et al. ............... 365/97 |
| 2004/0100817 A1* | 5/2004 | Subramanian et al. ....... 365/158 |
| 2004/0104425 A1* | 6/2004 | Kobayashi et al. ........... 257/321 |
| 2006/0008999 A1* | 1/2006 | Mohklesi ...................... 438/287 |

(Continued)

FOREIGN PATENT DOCUMENTS

JP    61-088578    5/1986
(Continued)

*Primary Examiner* — Fei Fei Yeung Lopez
(74) *Attorney, Agent, or Firm* — McDermott Will & Emery LLP

(57) ABSTRACT

In a current rectifying element (10), a barrier height φA of a center region (14) of a barrier layer (11) in a thickness direction thereof sandwiched between a first electrode layer (12) and a second electrode layer (13) is formed to be larger than a barrier height φB of a region in the vicinity of an interface (17) between the barrier layer (11) and the first electrode layer (12) and an interface (17) between the barrier layer (11) and the second electrode layer (13). The barrier layer (11) has, for example, a triple-layer structure of barrier layers (11a), (11b) and (11c). The barrier layers (11a), (11b) and (11c) are, for example, formed by SiN layers of $SiNx_2$, $SiNx_1$, and $SiNx_1$ (X1<X2). Therefore, the barrier layer (11) has a barrier height in which the shape changes in a stepwise manner and the height of the center region 14 is large.

14 Claims, 20 Drawing Sheets

U.S. PATENT DOCUMENTS

| | | |
|---|---|---|
| 2006/0098472 A1 | 5/2006 | Ahn et al. |
| 2006/0126423 A1* | 6/2006 | Aratani et al. ............... 365/232 |
| 2006/0255396 A1* | 11/2006 | Nara ............................. 257/315 |
| 2008/0150009 A1* | 6/2008 | Chen ............................. 257/325 |
| 2009/0052225 A1 | 2/2009 | Morimoto |

FOREIGN PATENT DOCUMENTS

| | | |
|---|---|---|
| JP | 02-168237 | 6/1990 |
| JP | 02-168238 | 6/1990 |
| JP | 02-168239 | 6/1990 |
| JP | 05-041551 | 2/1993 |
| JP | 5-501481 | 3/1993 |
| JP | 05-347422 | 12/1993 |
| JP | 06-018937 | 1/1994 |
| JP | 08-306988 | 11/1996 |
| JP | 09-129757 | 5/1997 |
| JP | 2005-317787 | 11/2005 |
| JP | 2006-140489 | 6/2006 |
| JP | 2006-203098 | 8/2006 |
| WO | WO 2006/075574 A1 | 7/2006 |

* cited by examiner (a)

(b)

(a)

(b)

<BEHAVIOR OF ΦB>

(a)

(b)

(c)

(d)

(a)

(b)

(c)

CURRENT RECTIFYING ELEMENT, MEMORY DEVICE INCORPORATING CURRENT RECTIFYING ELEMENT, AND FABRICATION METHOD THEREOF

RELATED APPLICATIONS

This application is the U.S. National Phase under 35 U.S.C. §371 of International Application No. PCT/JP2008/001867, filed on Jul. 11, 2008, which in turn claims the benefit of Japanese Application No. 2007-186622, filed on Jul. 18, 2007, the disclosures of which Applications are incorporated by reference herein.

TECHNICAL FIELD

The present invention relates to a current rectifying element which has a bidirectional and non-linear voltage-current characteristic with respect to an applied voltage and in which a ratio (ON/OFF ratio) of a current (ON-current) corresponding to a high voltage applied to a current (OFF-current) corresponding to a low voltage applied is large, a memory device incorporating the current rectifying element, and a fabrication method thereof.

BACKGROUND ART

In recent years, portable digital devices such as small-sized and thin digital AV players and digital cameras have been developed to have higher functionalities, and a demand for larger-capacity and higher-speed memory devices for use as memory devices for these devices have been increasing. As apparatuses for meeting such a demand, memory devices using ferroelectric capacitors or resistance variable layers have attracted attention.

The memory device including the resistance variable element using the resistance variable layer performs a reliable memory operation by typically connecting a current rectifying element or the like in series to the resistance variable element to prevent write disturb due to a bypass current or crosstalk between adjacent memory cells. The significant characteristic which the current rectifying element is required to have to achieve the reliable memory operation is such that an OFF-current flowing when a low voltage is applied to the both ends of the current rectifying element is low and an ON-current flowing when a high voltage is applied is high, i.e., an ON/OFF current ratio is large. Also, since the resistance variable element is commonly formed of a material which enables a resistance switching operation in the same manner in response to voltages which are different in polarity, it is desired that the current rectifying element connected in series to the resistance variable element exhibit a bidirectional and non-linear voltage-current characteristic with respect to the applied voltage. Therefore, such a characteristic is effective to the memory device which requires a positive voltage and a negative voltage and performs a bipolar operation. To be specific, as an example of such a memory device, there is a resistance variable memory device in which a resistance variable layer serving as a memory portion switches to a low-resistance state in response to a positive voltage applied or to a high-resistance state in response to a negative voltage applied, or the resistance variable layer switches to the high-resistance state in response to the positive voltage applied or to the low-resistance state in response to the negative voltage applied.

In many cases, the above-mentioned resistance variable memory device is configured to include memory cells arranged in cross-point array (see e.g., Patent document 1). By fabricating a memory cell in such a manner that, for example, a MIM (Metal-Insulator-Metal) diode or a MSM (Metal-Semiconductor-Metal) diode having the bidirectional and nonlinear voltage-current characteristic disclosed in Patent document 1 is connected in series to the resistance variable layer, a memory device which has a bidirectional and non-linear voltage-current characteristic and performs a bipolar operation is achieved.

There is also proposed a cross point memory device in which a current rectifying element with a large ON/OFF current ratio, for example, a PN junction diode or a Schottky diode is connected in series to a resistive element to form a memory cell which has a unidirectional and nonlinear voltage-current characteristic and a large ON/OFF current ratio (e.g., Patent document 2).

As a general method for fabricating a current rectifying element which is suitable for an electronic circuit or electronic device to which the current rectifying element is applied, an attempt is made to attain a desired nonlinear voltage-current characteristic by forming a metal-semiconductor junction or a metal-insulator junction by making use of a difference in work function between a material used for a barrier layer of the current rectifying element and a material used for electrode layers sandwiching the barrier layer (e.g., see Patent document 3). To be specific, in the current rectifying element of the metal-insulator-metal junction in Patent document 3, barrier height (height of an energy level of the barrier layer on the basis of an energy level of metal) is determined by Felmi level bound generated by grain boundary and transition of a polycrystalline compound semiconductor which is an insulator. Therefore, the height and shape of the barrier of the metal-insulator-metal junction is controlled by changing a composition and doping of the polycrystalline compound semiconductor. It is proposed that a desired nonlinear voltage-current characteristic of the current rectifying element is attained by controlling the height and shape of the barrier of the metal-insulator-metal junction.

Patent document 1: Japanese Laid-Open Patent Application Publication No. 2006-203098
Patent document 2: Japanese Laid-Open Patent Application Publication No. 2006-140489
Patent document 3: Japanese Laid-Open Patent Application Publication No. Hei. 5-41551

DISCLOSURE OF THE INVENTION

Problems to be Solved by the Invention

The memory device disclosed in Patent document 1 has a problem that since the ON/OFF ratio of the current flowing through the memory cell is small, a bypass current increases in amount in the whole memory cells in array, and a S/N ratio and a scale of the array cannot be increased. The memory device disclosed in Patent document 2 cannot be used with a resistance variable layer which performs a bipolar operation, because it does not have a bidirectional and non-linear voltage-current characteristic although its ON/OFF current ratio is large.

Patent document 3 discloses that the height and shape of the barrier of the current rectifying element can be controlled and this current rectifying element may be used as a current rectifying element which has a bidirectional and non-linear voltage-current characteristic with respect to the applied voltage. However, Patent document 3 fails to describe or suggest an element structure of the current rectifying element having a bidirectional and non-linear voltage-current characteristic, which achieves a large ON/OFF ratio.

For many resistance variable layers, a high current is required to switch resistance. In this case, a MSM diode in which the barrier layer has a small band gap is desirable as a bidirectional current steering element.

The present invention is directed to solving the above described problems, and an object of the present invention is to provide a current rectifying element which has a bidirectional and non-linear voltage-current characteristic with respect to an applied voltage and has a large ON-OFF current ratio, and a memory device which incorporates memory cells formed by using such bidirectional current rectifying elements and performs a bipolar operation. Another object of the present invention is to provide a fabrication method of the current rectifying elements and the memory device.

Means for Solving the Problem

To achieve the above mentioned object, a current steering element of the present invention is a current rectifying element, including a barrier layer, a first electrode layer, and a second electrode layer, the barrier layer being sandwiched between the first electrode layer and the second electrode layer; wherein the barrier layer includes an element A (A is nitrogen, carbon, or oxygen) and silicon; wherein the barrier layer is configured such that a content ratio of the element A to silicon is larger in a center region in a thickness direction thereof than in a region in the vicinity of an interface between the first electrode layer and the barrier layer and in a region in the vicinity of an interface between the second electrode layer and the barrier layer; and wherein the barrier layer has a barrier height which is larger in the center region in the thickness direction than in the region in the vicinity of the interface between the first electrode layer and the barrier layer and in the region in the vicinity of the interface between the second electrode layer and the barrier layer.

In such a configuration, it is possible to achieve a current rectifying element which has a bidirectional and non-linear voltage-current characteristic with respect to an applied voltage and has a large ON/OFF current ratio.

In addition, by using a silicon-based material, a mass-production process which is compatible with a semiconductor process adapted for miniaturization may be used, and the current rectifying element can be fabricated with a process which is adapted for high-dense integration and has high productivity.

A difference between the barrier height of the center region and the barrier height of the region in the vicinity of the interface may be 20 meV or larger.

In such a configuration, it is possible to achieve a current rectifying element which has a bidirectional and non-linear voltage-current characteristic with respect to an applied voltage and has a larger ON/OFF current ratio. In addition, it is possible to achieve an optimal bidirectional current rectifying element as, for example, a current rectifying element connected in series to a resistance variable element using a resistance variable layer and incorporated into a memory device.

A difference between the barrier height of the center region and the barrier height of the region in the vicinity of the interface may be 20 meV or larger and 220 meV or smaller.

In such a configuration, it is possible to achieve a current rectifying element which has a bidirectional and non-linear voltage-current characteristic with respect to an applied voltage and has a larger ON/OFF current ratio while maintaining an ON-current at a predetermined magnitude. In addition, it is possible to achieve an optimal bidirectional current rectifying element as, for example, a current rectifying element connected in series to a resistance variable element using a resistance variable layer and incorporated into a memory device.

The barrier layer may be made of a semiconductor material or an insulator material. A content of at least one of nitrogen, carbon, and oxygen may increase continuously from the region in the vicinity of the interface to the center region in the thickness direction.

In such a configuration, with a relatively simple process using the silicon-based material, it is possible to achieve a current rectifying element which is bidirectional and has a large ON-OFF current ratio.

The barrier layer may have a multi-layer structure including at least three layers in which a content of at least one of nitrogen, carbon, and oxygen is different. A content of at least one of nitrogen, carbon, and oxygen may increase in a stepwise manner from the region in the vicinity of the interface to the center region in a stacking direction.

In such a configuration, with a relatively simple process using the silicon-based material, it is possible to achieve a current rectifying element which is bidirectional and has a lower OFF-current and a larger ON-OFF current ratio.

A difference between a content of nitrogen in the center region and a content of nitrogen in the region in the vicinity of the interface may be 0.03 or larger.

In such a configuration, it is possible to achieve a current rectifying element which has a bidirectional and non-linear voltage-current characteristic with respect to an applied voltage and has a larger ON/OFF current ratio. In addition, it is possible to achieve an optimal bidirectional current rectifying element as, for example, a current rectifying element connected in series to a resistance variable element using a resistance variable layer and incorporated into a memory device.

A difference between a content of nitrogen in the center region and a content of nitrogen in the region in the vicinity of the interface may be 0.03 or larger and 0.31 or smaller.

In such a configuration, it is possible to achieve a current rectifying element which has a bidirectional and non-linear voltage-current characteristic with respect to an applied voltage and has a larger ON/OFF current ratio while maintaining an ON-current at a predetermined magnitude. In addition, it is possible to achieve an optimal bidirectional current rectifying element as, for example, a current rectifying element connected in series to a resistance variable element using a resistance variable layer and incorporated into a memory device.

A memory device of the present invention comprises a memory element including a lower electrode formed on a substrate, an upper electrode, and a resistance variable layer sandwiched between the lower electrode and the upper electrode; the current rectifying element according to any one of Claims 1 to 10; and an interlayer insulating layer formed on the substrate so as to cover the memory element and the current rectifying element; wherein the current rectifying element may be electrically connected in series to an upper side or a lower side of the memory element.

In such a configuration, since the memory cell of the memory device is fabricated such that the current rectifying element which is bidirectional and has a large ON-OFF current ratio is connected in series to the resistance variable element, it is possible to achieve a highly-reliable cross-point memory device which is operable stably without write disturb due to a bypass current from adjacent circuit elements and without influence of a noise or crosstalk.

A memory device of the present invention comprises a memory element including a lower electrode formed on a substrate, an upper electrode, and a resistance variable layer sandwiched between the lower electrode and the upper electrode; the current rectifying element according to any one of Claims 1 to 10; and an interlayer insulating layer formed on the substrate so as to cover the memory element and the current rectifying element. The lower electrode may be formed on the substrate in a stripe shape. The second electrode layer may be formed in a stripe shape so as to cross the lower electrode. The current rectifying element may be electrically connected in series to an upper side or a lower side of the memory element; and the memory element may include the resistance variable layer and the current rectifying element which are provided at a cross portion where the lower electrode and the second electrode layer cross each other.

In such a configuration, since the memory cell of the memory device is fabricated such that the current rectifying element which is bidirectional and has a large ON-OFF current ratio is connected in series to the resistance variable element, it is possible to achieve a highly-reliable cross-point memory device which is operable stably without write disturb due to a bypass current from adjacent circuit elements and adjacent memory cells and without influence of a noise or crosstalk.

The resistance variable layer may be configured to perform a memory operation such that the resistance variable layer switches to a low-resistance state in response to a positive voltage applied and to a high-resistance state in response to a negative voltage applied, or switches to the high-resistance state in response to the positive voltage applied and to the low-resistance state in response to the negative voltage applied.

In such a configuration, it is possible to achieve a memory device which performs a stable memory operation using both of the positive voltage and the negative voltage.

The resistance variable layer may include at least a tantalum oxide, and a resistance value of the resistance variable layer is switchable reversibly in response to an electrical signal applied between the lower electrode and the second electrode layer.

In such a configuration, since the memory cell including the resistance variable layer is capable of stably performing a memory operation, a stable memory device is achieved.

The current rectifying element may be configured to perform an operation for restricting (steering) a current in a low-voltage range bidirectionally in response to an electrical signal applied between the lower electrode and the second electrode layer.

In such a configuration, it is possible to achieve a highly-reliable memory device which is operable bidirectionally and stably without write disturb due to a bypass current from adjacent circuit elements and adjacent memory cells and without influence of a noise or crosstalk.

A method of fabricating a current rectifying element, of the present invention, comprises a barrier layer forming step for forming a barrier layer on the first electrode layer; and a step for forming a second electrode layer on the barrier layer; wherein in the barrier layer forming step, the barrier layer may be formed such that a barrier height is larger in a center region in a thickness direction thereof than in a region in the vicinity of an interface between the first electrode layer and the barrier layer and in a region in the vicinity of an interface between the second electrode layer and the barrier layer, by changing partial gas pressures of plural gases.

In such a method, it is possible to fabricate a current rectifying element which has a bidirectional and non-linear voltage-current characteristic with respect to an applied voltage and has a large ON/OFF current ratio.

A method of fabricating a memory device, of the present invention comprises a step (a) for forming a stripe-shaped lower electrode layer on a substrate; a step (b) for forming a first interlayer insulating layer on the lower electrode layer and on the substrate; a step (c) for forming a contact hole such that the contact hole penetrates through the first interlayer insulating layer on the lower electrode layer and exposes the lower electrode layer; a step (d) for embedding a resistance variable layer in the contact hole; a step (e) for forming a first electrode layer, a barrier layer and a second electrode layer sequentially on the first interlayer insulating layer so as to cover the resistance variable layer, to form a current rectifying element such that the current rectifying element is electrically connected in series to the resistance variable layer; and a step (f) for forming an upper electrode layer such that the upper electrode layer is electrically connected to the second electrode layer and crosses the lower electrode layer in a stripe shape, wherein the barrier layer of the current rectifying element is formed such that an element content of a material of a center region in a thickness direction thereof sandwiched between the first electrode layer and the second electrode layer is different from an element content of a material of a region in the vicinity of an interface between the first electrode layer and the barrier layer and an element content of a material of a region in the vicinity of an interface between the second electrode layer and the barrier layer, and a barrier height of the material of the center region is larger than a barrier height of the material of the region in the vicinity of the interface.

In such a method, it is possible to fabricate a highly-reliable memory device which is operable bidirectionally and stably without write disturb due to a bypass current from adjacent circuit elements and adjacent memory cells and without influence of a noise or crosstalk, using a mass-production process which is compatible with a semiconductor process adapted for miniaturization.

The method may further comprise a step (g) for forming a second interlayer insulating layer so as to cover the first interlayer insulating layer, the barrier layer, the second electrode layer and the upper electrode layer after the step (f).

In such a method, the electrode layer exposed on the upper surface can be protected by the second interlayer insulating layer, and insulation between adjacent elements can be ensured.

A method of fabricating a memory device of the present invention comprises a step (a) for forming a stripe-shaped first electrode layer on a substrate; a step (b) for forming a barrier layer on the first electrode layer; a step (c) for forming a first interlayer insulating layer on the substrate and on the barrier layer; a step (d) for forming a first contact hole such that the first contact hole penetrates through the first interlayer insulating layer on the barrier layer and exposes the barrier layer; a step (e) for forming a second electrode layer on the first contact hole; a step (f) for forming a second interlayer insulating layer on the first interlayer insulating layer and on the second electrode layer; a step (g) for forming a second contact hole such that the second contact hole penetrates through the second interlayer insulating layer on the second electrode layer and exposes the second electrode layer; a step (h) for embedding a resistance variable layer in the second contact hole; and a step (i) for forming an upper electrode layer on the second interlayer insulating layer such that the upper electrode layer covers the resistance variable layer and crosses the first electrode layer in a stripe shape; wherein the barrier layer of the current rectifying element may be formed such that an element content of a material of a center region in a thickness direction thereof sandwiched between the first electrode layer and the second electrode layer is different from an element content of a material of a region in the vicinity of an interface between the first electrode layer and the barrier layer and an element content of a material of a region in the vicinity of an interface between the second electrode layer and the barrier layer, and a barrier height of the material of the center region is larger than a barrier height of the material of the region in the vicinity of the interface.

In such a method, it is possible to fabricate a highly-reliable memory device which is operable bidirectionally and stably without write disturb due to a bypass current from adjacent circuit elements and adjacent memory cells and without influence of a noise or crosstalk, using a mass-production process which is compatible with a semiconductor process adapted for miniaturization.

The method may further comprise a step (j) for forming a third interlayer insulating layer so as to cover the second interlayer insulating layer and the upper electrode after the step (i).

In such a method, the electrode layer exposed on the upper surface can be protected by the third interlayer insulating layer, and insulation between adjacent elements can be ensured.

The barrier layer may be formed such that the element content of the material of the center region is made different from the element content of the material of the region in the vicinity of the interface so that a difference between the barrier height of the center region and the barrier height of the region in the vicinity of the interface is 20 meV or larger.

In such a method, it is possible to fabricate a memory device incorporating a current rectifying element which has a bidirectional and non-linear voltage current characteristic with respect to an applied voltage and a larger ON/OFF current ratio. In addition, it is possible to fabricate a memory device including the resistance variable element using the resistance variable layer and an optimal bidirectional current rectifying element as, for example, a current rectifying element connected in series to the resistance variable element.

The barrier layer may be formed such that the element content of the material of the center region is made different from the element content of the material of the region in the vicinity of the interface so that a difference between the barrier height of the center region and the barrier height of the region in the vicinity of the interface is 20 meV or larger and 220 meV or smaller.

In such a method, it is possible to fabricate a memory device incorporating a current rectifying element which has a bidirectional and non-linear voltage-current characteristic with respect to an applied voltage and has a larger ON/OFF current ratio while maintaining an ON-current at a predetermined magnitude. In addition, it is possible to fabricate a memory device including a resistance variable element using the resistance variable layer and an optimal bidirectional current rectifying element as, for example, a current rectifying element connected in series to the resistance variable element.

The barrier layer may be formed such that a content of one of nitrogen, carbon, and oxygen is higher in the center region in the thickness direction than in the region in the vicinity of the interface.

In such a method, it is possible to fabricate a memory device including a current rectifying element which is bidirectional and has a large ON-OFF current ratio.

The barrier layer may be formed to have a multi-layer structure including at least three layers in which a content of one of nitrogen, carbon, and oxygen is different. The content of one of nitrogen, carbon, and oxygen may increase in a stepwise manner from the region in the vicinity of the interface to the center region in a stacking direction.

In such a method, it is possible to fabricate a highly-reliable memory device which is operable stably without write disturb due to a bypass current from adjacent circuit elements and adjacent memory cells and without influence of a noise or crosstalk, using a mass-production process which is compatible with a semiconductor process adapted for miniaturization.

The above and further objects, features and advantages of the present invention will more fully be apparent from the following detailed description of the preferred embodiments with reference to the accompanying drawings.

Effects of the Invention

Since the barrier height of the center region of the barrier layer is larger than the barrier height of the region in the vicinity of the interface between the barrier layer and the electrode in the current rectifying element of the present invention, it is possible to achieve a current rectifying element which has a bidirectional and non-linear voltage-current characteristic with respect to an applied voltage and has a large ON/OFF current ratio. To be specific, in an OFF-state in which a low voltage is applied to the current rectifying element, since the flow of the current is restricted by the barrier height of the center region of the barrier layer, an OFF-current is suppressed to a small magnitude. On the other hand, in an ON-state in which a high voltage is applied to the current rectifying element, since the barrier height of the center region of the barrier layer is sufficiently pushed down by the applied voltage, the current is merely restricted by the barrier height of the region in the vicinity of interface which is smaller than the barrier height of the center region, and therefore, a large ON-current flows. Therefore, it is possible to achieve a current rectifying element which has a large ON/OFF current ratio of the current flowing through the current rectifying element when the applied voltage is changed from the low voltage to the high voltage.

In the memory device of the present invention including memory cells each including the above described current rectifying element, it is possible to achieve a highly-reliable memory device which is operable stably without write disturb due to a bypass current from adjacent circuit elements and adjacent memory cells and without influence of a noise or crosstalk.

In the fabrication method of the cross-point memory device of the present invention, it is possible to fabricate a highly-reliable memory device which is operable bidirectionally and stably without write disturb due to a bypass current from adjacent circuit elements and adjacent memory cells and without influence of a noise or crosstalk, using a mass production process which is compatible with the semiconductor process adapted for miniaturization. Therefore, the memory device can be fabricated with a mass production process which is compatible with a process adapted for miniaturization which is mainly based on a process rule less than 100 nm.

Since the current rectifying element of the present invention has a bidirectional and non-linear voltage-current characteristic and is operable with a large ON/OFF current ratio, it may be incorporated into various devices and circuits such as electronic devices such as portable information devices and information home appliance, regardless of, for example, the polarity of the electric power supply, and is operable stably without an influence of a noise or crosstalk.

Furthermore, by using the memory device of the present invention, the electronic devices such as portable information

BRIEF DESCRIPTION OF THE DRAWINGS

FIG. 2 is a view showing the shape of a barrier height of a barrier layer of the current rectifying element according to Embodiment 1 of the present invention, in which FIG. 2(a) is a view showing the shape of the barrier height in a state where no voltage is applied between electrode layers, and FIGS. 2(b) and 2(c) are views showing the shape of the barrier height in a state where a voltage V is applied between the electrode layers.

FIG. 4 is a view showing a current-voltage characteristic of the current rectifying element in a case where the thickness of a convex portion of a center region of the barrier layer of the current rectifying element according to Embodiment 1 of the present invention is changed, in which FIG. 4(a) is a view showing the shape of the barrier height of the barrier layer and FIG. 4(b) is a view showing a current-voltage characteristic of the current rectifying element of FIG. 4(a).

FIG. 5 is a view showing a current-voltage characteristic of another current rectifying element according to Embodiment 1 of the present invention, in a case where the barrier height of the center region of the barrier layer of the current rectifying element is changed, in which FIG. 5(a) is a view showing the shape of the barrier height of the barrier layer and FIG. 5(b) is a view showing a current-voltage characteristic of the current rectifying element of FIG. 5(a).

FIG. 9 is a schematic view showing content profiles of Si and N within the barrier layer and the shape of the barrier height in the current rectifying element according to the Embodiment 1 of the present invention, in which FIG. 9(a) is a schematic view showing the content profiles of Si and N of a SiNx barrier layer, FIG. 9(b) is a schematic view showing the shape of the barrier height corresponding to the content profiles of FIG. 9(a), FIG. 9(c) is a schematic view showing the content profiles of Si and N of a SiNx barrier layer having a triple-layer structure, and FIG. 9(d) is a schematic view showing the shape of the barrier height corresponding to the content profiles of FIG. 9(c).

FIG. 10 is a schematic view showing content profiles of Si and N within the barrier layer and the shape of the barrier height in another current rectifying element according to Embodiment 1 of the present invention, in which FIG. 10(a) is a schematic view showing the content profiles of Si and N of the SiNx barrier layer, FIG. 10(b) is a schematic view showing the shape of the barrier height corresponding to the content profiles of FIG. 10(a), FIG. 10(c) is a schematic view showing that a maximum value of an element content in the content profile of N of the SiNx barrier layer is not located at the center of the barrier layer, and FIG. 10(d) is a schematic view showing the shape of the barrier height corresponding to the content profile of FIG. 10(c).

FIG. 12 is a view of a schematic configuration of a memory device according to Embodiment 2 of the present invention, in which FIG. 12(a) is a view showing the schematic configuration of the memory device as viewed from a semiconductor chip surface, FIG. 12(b) is a schematic cross-sectional view taken in the direction of arrows along line B-B of FIG. 12(a) and FIG. 12(c) is a schematic cross-sectional view taken in the direction of arrows along line C-C of FIG. 12(a).

FIG. 17 is a schematic cross-sectional view of the cross-point memory device according to Embodiment 2 of the present invention, in which FIG. 17(a) is a schematic cross-sectional view taken in the direction of arrows along line G-G of FIG. 16 and FIG. 17(b) is a schematic cross-sectional view taken in the directions of arrows along line H-H of FIG. 16.

FIG. 21 is a view of a schematic configuration of a memory device according to Embodiment 4 of the present invention, in which FIG. 21(a) is a view showing the schematic configuration of the memory device as viewed from a semiconductor chip surface, FIG. 21(b) is a schematic cross-sectional view taken in the direction of arrows along line B-B of FIG. 21(a), and FIG. 21(c) is a schematic cross-sectional view taken in the direction of arrows along line C-C of FIG. 21(a).

Figure 1:
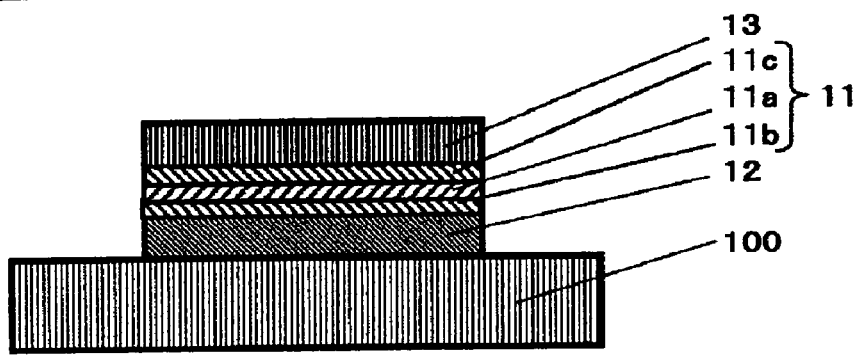
FIG. 1 is a schematic cross-sectional view of a current rectifying element according to Embodiment 1 of the present invention.

EXPLANATION OF REFERENCE NUMERALS 10, 18, 50, 70 current rectifying elements
11, 11a, 11b, 11c, 28 barrier layers
12, 27 first electrode layers 13, 29 (29a, 29b, 29c, 29d, 29e, 29f, 29g, 29h) second electrode layers
14 center region
15, 16 current
17 interface
20, 40, 60, 200, 250 memory devices
21, 41 semiconductor chip surfaces
22, 100 substrates
23 (23a, 23b, 23c, 23d, 23e, 23f, 23g, 23h) lower electrodes
24 resistance variable layer
25 upper electrode
26, 51, 71 resistance variable elements
31 first interlayer insulating layer (element interlayer insulating layer)
34 contact hole
36 SiN layer
37 Al electrode layer
38 second interlayer insulating layer
39, 52, 63, 72 memory elements (memory cells)
42 element interlayer insulating layer
43 recess
47 metal wire layer
61 lower interlayer insulating layer
62 lower contact hole
201, 251 memory main sections
202, 252 memory arrays
203 row select circuit/driver
204 column select circuit/driver
205 write circuit
206 sense amplifier
207 data input/output circuit
208 address input circuit
209 control circuit

BEST MODE FOR CARRYING OUT THE INVENTION

Hereinafter, a current rectifying element according to Embodiments of the present invention, a memory device incorporating the current rectifying element and a fabrication method thereof will be described with reference to the drawings. In the drawings, description of the components designated by the same reference numerals will be omitted in some cases.

Embodiment 1

Figure 2:
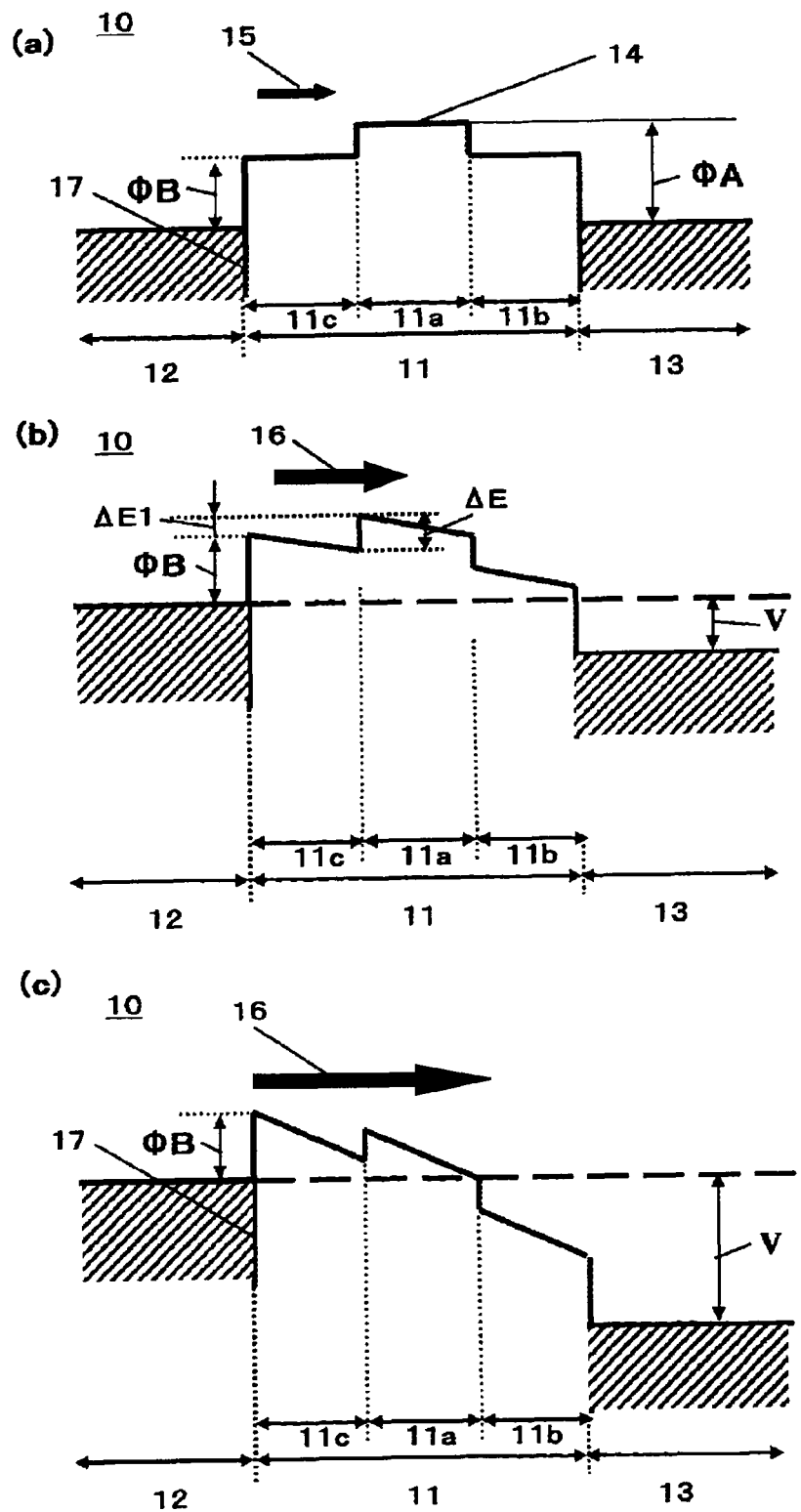

FIG. 1 is a schematic cross-sectional view of a current rectifying element 10 (element exhibiting a nonlinear [a resistance value is large in a region (low-voltage range) in which an absolute value of a voltage is small and a resistance value is small in a region (high-voltage range) in which an absolute value of a voltage is large] current characteristic with respect to positive and negative voltages and a bidirectional current steering element) according to Embodiment 1 of the present invention. FIG. 2 is a view showing the shape of a barrier height of a barrier layer 11 sandwiched between electrode layers 12 and 13, in which FIG. 2(a) is a view showing the shape of the barrier height of the barrier layer 11 in a state where no voltage is applied between the first electrode layer 12 and the second electrode layer 13, and FIGS. 2(b) and 2(c) are views showing the shapes of the barrier height of the barrier layer 11 in a state where a voltage V is applied between the first electrode layer 12 and the second electrode layer 13.

As shown in FIG. 1, the current rectifying element 10 according to this embodiment has a structure in which the barrier layer 11 is sandwiched between the first electrode layer 12 and the second electrode layer 13 on a substrate 100. In the current rectifying element 10, as shown in FIG. 2(a), the barrier layer 11 is formed such that a barrier height $\Phi A$ of a center region 14 in a thickness direction which is sandwiched between the first electrode layer 12 and the second electrode layer 13 is larger than a barrier height $\Phi B$ of a region in the vicinity of an interface 17 between the barrier layer 11 and the first electrode layer 12 and a region in the vicinity of the interface 17 between the barrier layer 11 and the second electrode layer 13. As shown in FIG. 1, the barrier layer 11 has a triple-layer structure of barrier layers 11a, 11b, and 11c. For the sake of explanation, in the example illustrated here, the barrier layers 11a, 11b and 11c are formed by a SiN layer having a triple-layer structure of $SiNx_2$, $SiNx_1$, and $SiNx_1$ (X1<X2) which are, for example, a silicon containing nitrogen, and have a structure in which the shape of the barrier height changes in a stepwise manner and the center region 14 is higher, which will be described in detail later.

Next, a basic operation of the current rectifying element of this embodiment will be described schematically with reference to FIG. 2. As shown in FIGS. 2(a) and 2(b), in a low-voltage state in which the voltage applied between the first electrode layer 12 and the second electrode layer 13 of the current rectifying element 10 is zero or low, a current 15 which is an OFF-current is very low, because the current flowing through the current rectifying element is blocked by the barrier height $\Phi A$ which is larger than the barrier height $\Phi B$. In other words, as shown in FIG. 2(a), when the applied voltage is near zero bias, electrons which are carriers generating the current 15 feel the barrier height $\Phi A$. As shown in FIG. 2(b), upon application of a voltage V to the barrier layer 11, the barrier height felt by the electrons changes from $\Phi A$ to $\Phi B$ according to the magnitude of the voltage V. FIG. 2(b) shows that the barrier height of the barrier layer 11a and the barrier layer 11b or the barrier layer 11c under the zero bias condition is $\Delta E$, but the barrier height felt by the electrons when the barrier layer 11 is biased with the applied voltage V changes to $\Phi A + \Delta E 1$ which is a value between $\Phi A$ and $\Phi B$. Therefore, a current 16 which is an ON-current flowing through the current rectifying element increases rapidly according to an increase in the magnitude of the applied voltage V.

FIG. 2(c) shows that a voltage V which is higher is applied between the first electrode layer 12 and the second electrode layer 13 of the current rectifying element 10, and a potential energy of the electrons of the second electrode layer 13 is lower by the applied voltage V. Thereby, the barrier height of the barrier layer 11 having the triple-layer structure decreases in a rightward direction. Therefore, the barrier height felt by the electrons is a barrier height $\Phi B$ of the region in the vicinity of the interface 17 between the first electrode layer 12 and the barrier layer 11.

As described above, the current 15 which is the OFF-current is restricted at the barrier height $\Phi A$ ($\Phi A > \Phi B$) by the barrier layer 11, while the current 16 which is the ON-current is restricted at $\Phi B$ which is smaller than $\Phi A$ by the barrier layer 11. Thus, the current rectifying element 10 with a low OFF-current and with a high ON-current is attainable.

The event that the barrier height of the barrier layer 11 decreases in a rightward direction in response to the applied voltage V occurs in the same manner in the barrier layer 11 having the triple-layer structure illustrated in this embodiment and a general barrier layer formed by a single layer being equal in a total width to the three layers and having the barrier height $\Phi B$. Therefore, the magnitude of the ON-current is equal in these two structures. However, in a case where the applied voltage is zero or near zero bias, the barrier height ΦA of the barrier layer 11a of the center region 14 surely blocks the electrons which could travel beyond the barrier height ΦB. Therefore, the magnitude of the current 15 can be made much smaller in the current rectifying element 10 of this embodiment than in a current rectifying element having a general barrier layer. Thus, the current rectifying element 10 of this embodiment is capable of increasing the ON-OFF current ratio.

As shown in FIG. 2(a), the barrier height of the region in the vicinity of the interface 17 between the first electrode layer 12 and the barrier layer 11 and the barrier height of the region in the vicinity of the interface 17 between the second electrode layer 13 and the barrier layer 11 are ΦB and are equal, and the barrier layer 11 (11c, 11a, 11b) having the triple-layer structure which is sandwiched between the first electrode layer 12 and the second electrode layer 13 has a structure which is laterally symmetric. Because of this, if the voltage V to be applied between the first electrode layer 12 and the second electrode layer 13 is inverted, then the direction of the currents 15 and 16 is merely inverted. Since the same OFF-current flows as the current 15 and the same ON-current flows as the current 16 as described above, the current rectifying element 10 which has a large ON/OFF current ratio is achieved.

Because of the above structure, the current rectifying element 10 which has a bidirectional and non-linear voltage-current characteristic with respect to the applied voltage V and has a large ON/OFF current ratio is achieved.

Next, the current-voltage characteristic of the current rectifying element of this embodiment will be described in greater detail.

Figure 3:
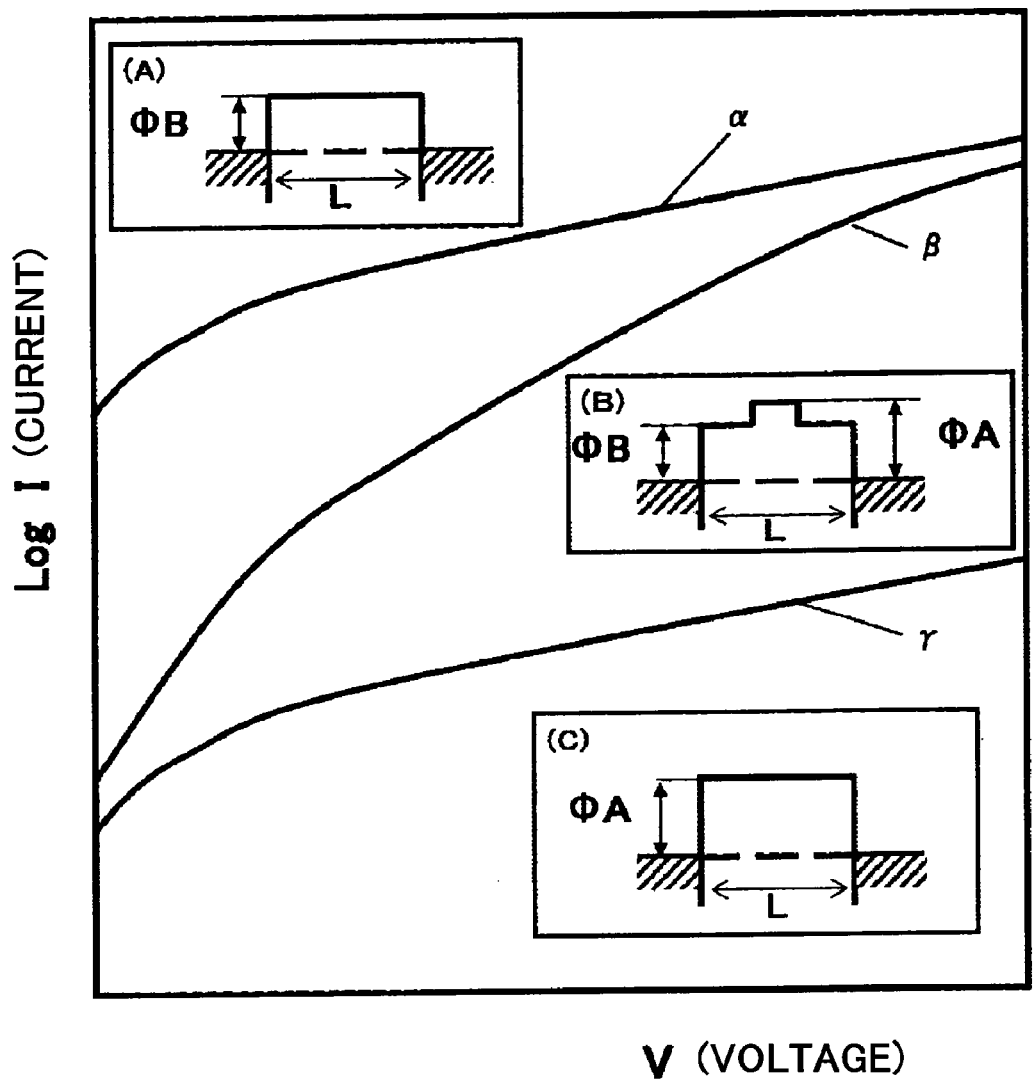
FIG. 3 is a view showing a current-voltage characteristic of the current rectifying element according to Embodiment 1 of the present invention.

FIG. 3 is a view showing the current-voltage characteristic of the current rectifying element. FIG. 3 shows current-voltage (I-V) characteristics α, β, γ of the three current rectifying elements (A), (B), and (C) which are different from the current rectifying element 10 shown in FIG. 2 in barrier heights ΦA, ΦB and the shape of the barrier height of the barrier layer 11. The current I is expressed as Log I. The current on a vertical axis indicates a value of the ON-current or a value of the OFF-current and the voltage on a horizontal axis indicates the magnitude of the voltage applied to the barrier layer of the current rectifying element.

In FIG. 3, the current-voltage characteristic γ is a non-linear voltage-current characteristic of the current rectifying element in which the barrier height has a flat shape of ΦA, i.e., the barrier height within the barrier layer is ΦA and constant. The current-voltage characteristic β is a non-linear voltage-current characteristic of the current rectifying element having a barrier height of a stepwise-convex shape in which the barrier height of the region in the vicinity of the interface 17 between each of the electrode layers and the barrier layer of the current rectifying element is ΦB which is smaller than ΦA, and the barrier height of the center region 14 in the thickness direction of the barrier layer 11 is ΦA. The current-voltage characteristic a is a non-linear voltage-current characteristic of the current rectifying element in which the barrier height has a flat shape of (I) B, i.e., the barrier height within the barrier layer is ΦB and constant. The barrier layers are configured to have barrier heights meeting ΦA>ΦB and an equal width expressed as L.

As shown in FIG. 3, it can be seen from the current-voltage characteristic γ that the barrier height ΦA of the current rectifying element (C) is large, and therefore the OFF-current at a low voltage V and the ON-current at a high voltage V, are small values. On the other hand, it can be seen from the current-voltage characteristic a that the barrier height ΦB of the current rectifying element (A) is smaller than ΦA, and therefore, the OFF-current and the ON-current have large values.

As shown in FIG. 3, when the voltage V is low, the current I flowing is surely blocked by the barrier height ΦA in the current rectifying element (B), and the current rectifying element (B) exhibits a low OFF-current which is close to that of the current rectifying element (C) of the current-voltage characteristic α. As shown in FIG. 2(c), when the voltage V is high, the barrier height of the center region 14 is smaller than the barrier height ΦB of the region in the vicinity of the interface 17 due to the voltage V applied, and therefore the current I flowing is determined by the barrier height ΦB. This means that the current rectifying element (B) flows a high current I which is close in value to the ON-current indicated by the current-voltage characteristic α of the current rectifying element (A) when the voltage V is high. It should be noted that it is important to select the materials and composition of the layers forming the barrier layer 11 of the current rectifying element 10 shown in FIG. 2 to achieve such a high ON-current and such a low OFF-current. When selecting the materials and composition of the layers forming the barrier layer 11, it is necessary to consider the voltage V at which the current rectifying element 10 operates.

Therefore, by selecting the materials and composition of the layers forming the barrier layer 11 considering the voltage V, the current rectifying element (B) described in this embodiment, exhibiting the current-voltage characteristic β with a large ON-OFF current ratio as shown in FIG. 3 is achieved as the current rectifying element 10 of FIG. 2.

Figure 4:
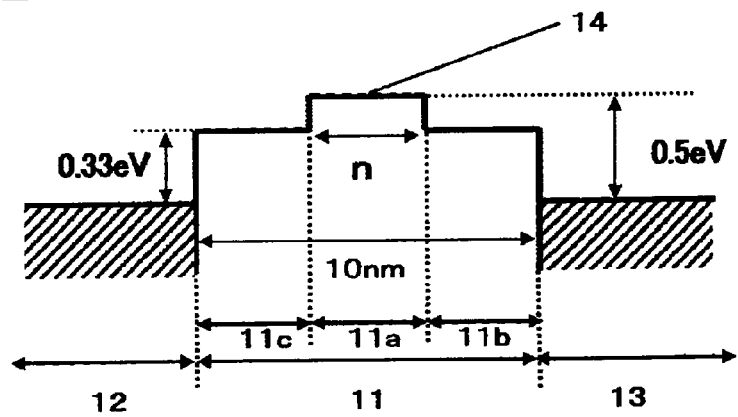
Figure 4:
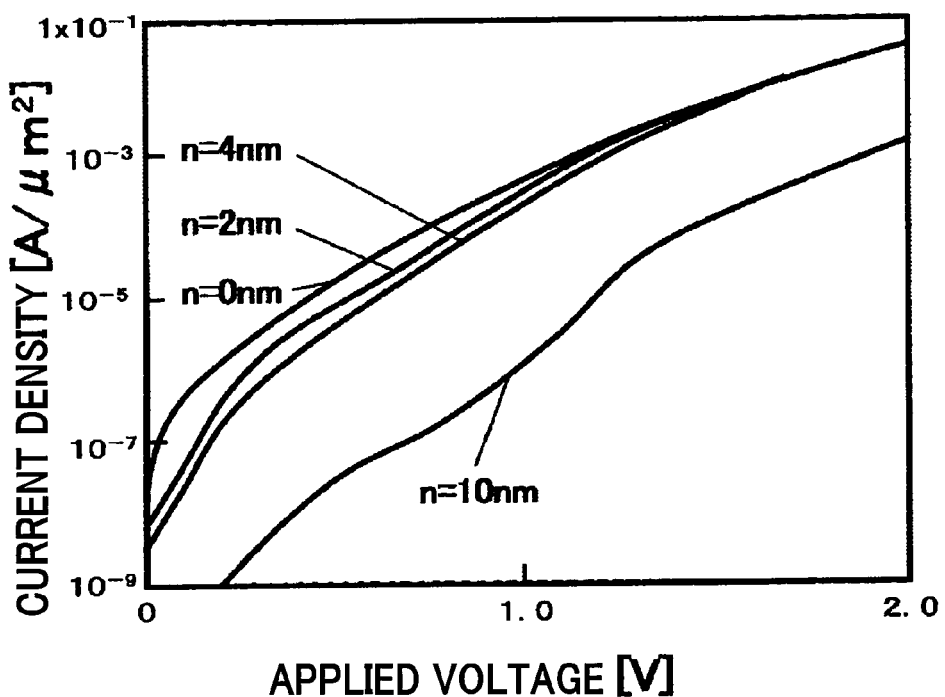
Figure 5:
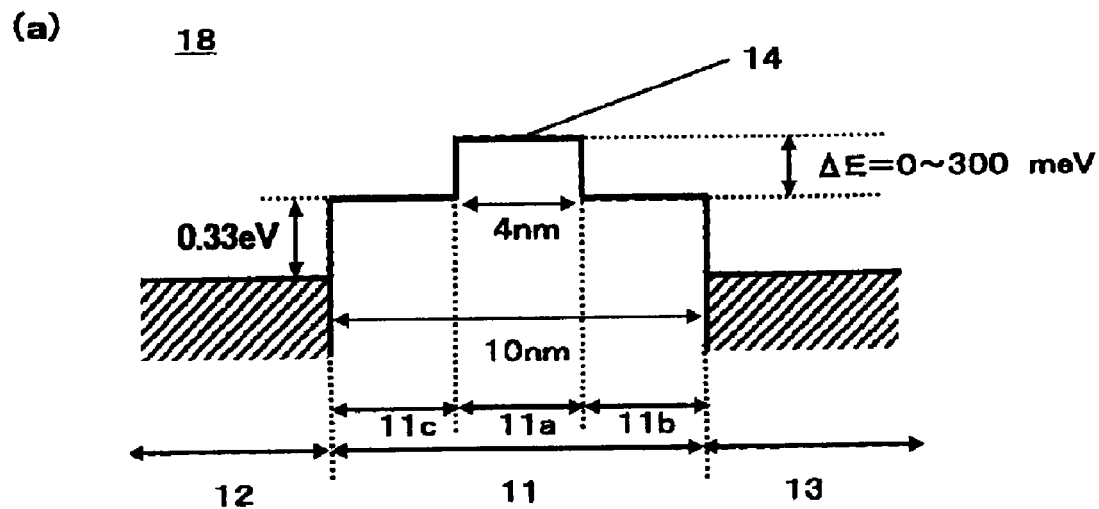
Figure 5:
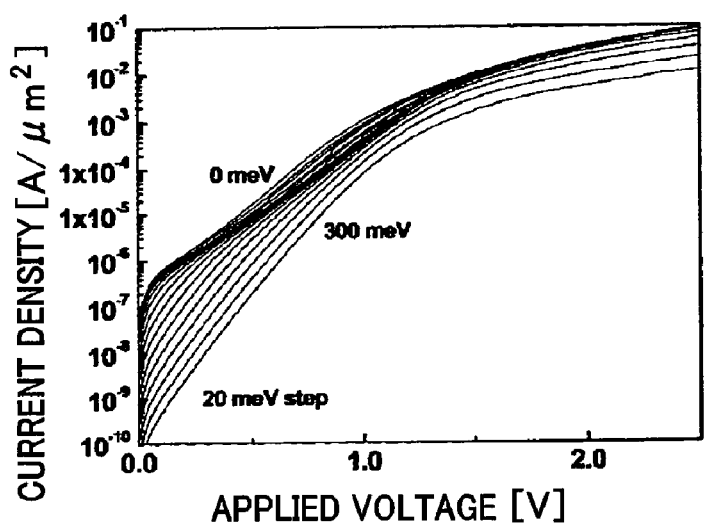

FIG. 4 and FIG. 5 show a current-voltage characteristic of a current rectifying element 10 and a current-voltage characteristic of a current rectifying element 18, respectively, in a case where the thickness of the convex portion of the center region 14 of the barrier layer 11 is made different in each of the current rectifying elements 10 and 18. A vertical axis indicates a current density and a horizontal axis indicates an applied voltage.

FIG. 4(a) and FIG. 5(a) schematically show the structure of the current rectifying element 10 and the structure of the current rectifying element 18, respectively, and show two examples in which the barrier height of the barrier layer 11a of the center region shown in FIG. 2 is different. In the example shown in FIG. 4(a), the barrier height is 0.5 eV. In the example shown in FIG. 5(a), the barrier height is 0.33 eV+ΔE. In this case, ΔE=0~300 meV. FIG. 4(a) shows that the barrier height of the region in the vicinity of the interface 17 is 0.33 eV, the barrier height of the barrier layer 11a of the center region 14 is 0.5 eV, the thickness of the barrier layer 11 is 10 nm, and the thickness of the barrier layer 11a is n. FIG. 4(b) shows the current-voltage characteristics of the current rectifying element 10 in cases where the thicknesses n of the barrier layer 11a of the current rectifying element 10 are 0 nm, 2 nm, 4 nm, and 10 nm. As can be seen, the values of the OFF-current respectively corresponding to 0 m, 2 nm, and 4 nm which is the thickness n of the barrier layer 11a decrease in the order of 0 nm, 2 nm, and 4 nm. This means that the OFF-current is more effectively blocked as the thickness of the barrier layer 11a increases. This implies that when the low voltage which is zero or near zero is applied to the barrier layer 11, the thickness of the barrier layer 11a increases and thereby an actual barrier height felt by the electrons increases, increasing an actual resistance.

On the other hand, the ON-current at a high voltage applied has an approximately equal value when the thickness n of the barrier layer 11a is 0 nm, 2 nm, and 4 nm. This means that the barrier height of the barrier layer 11a is substantially equal to or lower than the barrier height of the region in the vicinity of the interface 17 by applying the high voltage V to the current rectifying element 10. The barrier layer 11 in which the thickness n of the barrier layer 11a is 0 nm corresponds to the current rectifying element 10 which has a 0.33 eV barrier height of a flat shape. The barrier layer 11 in which the thickness n of the barrier layer 11a is 10 nm corresponds to the current rectifying element 10 which has a 0.5 eV barrier height of a flat shape. The current-voltage characteristic of the current rectifying element 10 in which the thickness n of the barrier layer 11a is 2 nm or 4 nm, which is shown in FIG. 4(b), is substantially the same as the current-voltage characteristic of the current rectifying element 10 of this embodiment. In other words, in this case, in the current rectifying element 10, the OFF-current has a minimum value close to the current value corresponding to n=10 nm and the ON-current has a maximum value which is approximately equal to the current value corresponding to n=0 nm. In such a configuration, the current rectifying element 10 exhibiting a bidirectional and non-linear voltage-current characteristic and having a large ON/OFF current ratio, is achieved.

As another example which is different from the example of FIG. 4(a), FIG. 5(a) shows the current rectifying element 18 in which the barrier height of the region in the vicinity of the interface 17 is 0.33 eV, the barrier height of the barrier layer 11a of the center region is 0.33 eV+$\Delta$E, the thickness of the barrier layer 11 is 10 nm, and the thickness of the barrier layer 11a is 4 nm. FIG. 5(b) shows the current-voltage characteristic of the current rectifying element 18 of FIG. 5(a) in cases where $\Delta$E of the barrier layer 11a of the current rectifying element 18 in FIG. 5(a) is changed from 0~300 meV at 20 meV step. As shown, the value of the OFF-current with the voltage applied being zero decreases as $\Delta$E of the barrier layer 11a increases from 0 meV up to 300 meV at 20 meV step, and the OFF-current is effectively blocked by an increase in $\Delta$E of the barrier layer 11a. Therefore, by setting the difference between the barrier height of the center region of the barrier layer 11 and the barrier height of the region in the vicinity of the interface 17, i.e., $\Delta$E, to 20 meV or larger, the OFF-current can be reduced more greatly than in the case of $\Delta$E=0 meV.

As shown in FIG. 5(b), when the applied voltage is high (about 1.3V or higher), the ON-current has a substantially equal value in a range where $\Delta$E of the barrier layer 11a is between 0 and 220 meV and starts to decrease gradually when $\Delta$E exceeds 220 meV until it reaches 300 meV. By setting the difference $\Delta$E between the barrier height of the center region of the barrier layer 11 and the barrier height of the region in the vicinity of the interface 17 to 20 meV or larger and 220 meV or smaller based on the result shown in FIG. 5(b), it is possible to achieve a current rectifying element exhibiting a bidirectional and non-linear voltage-current characteristic with respect to the applied voltage and has a larger ON/OFF current ratio while maintaining the ON-current at a specified magnitude.

Figure 6:
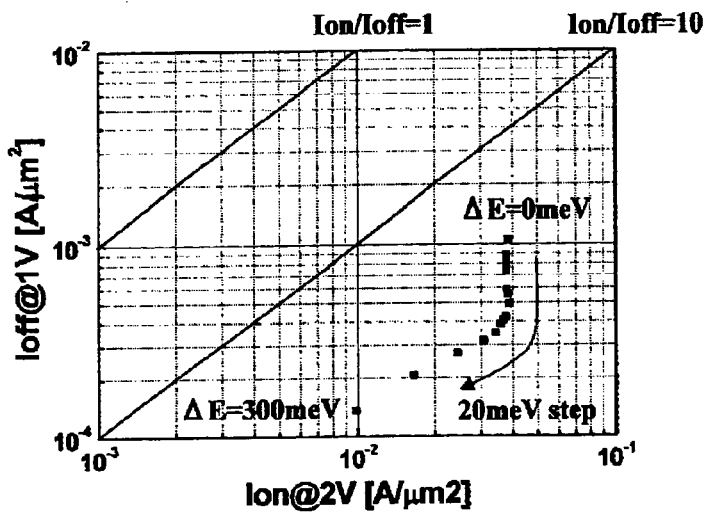
FIG. 6 is a view showing the relationship between the value of an ON-current and the value of an OFF-current of the current rectifying element according to Embodiment 1 of the present invention.

FIG. 6 shows the relationship between an ON-current $I_{on}$ at 2V and an OFF-current $I_{off}$ at 1V in the current rectifying element 18 according to this embodiment, in a case where $\Delta$E is changed from 0~300 meV at 20 meV step. In FIG. 6, inclined straight lines indicate a ratio of the ON-current $I_{on}$ to the OFF-current $I_{off}$, i.e., ON-OFF current ratio $I_{on}/I_{off}$. As can be seen from FIG. 6, when $\Delta$E is increased from 0 meV to 220 meV, only the OFF-current $I_{off}$ decreases but the ON-current $I_{on}$ maintains a substantially constant value. Concurrently, the ON-OFF current ratio $I_{on}/I_{off}$ decreases. As shown, when $\Delta$E exceeds 220 meV and increases up to 300 meV, the ON-OFF current ratio $I_{on}/I_{off}$ is substantially constant, and both of OFF-current $I_{off}$ and ON-current $I_{on}$ decrease together.

Therefore, the current rectifying element 10 is formed to have a structure such that the difference ($\Phi$A-$\Phi$B) between the barrier height $\Phi$A of the center region 14 and the barrier height $\Phi$B of the region in the vicinity of the interface 17 is 20 meV or larger and 220 meV or smaller. By forming such a structure, it is possible to achieve a current rectifying element which is capable of flowing an ON-current as high as the ON-current of the conventional current rectifying element and capable of making the above mentioned ON-OFF current ratio larger than that of the conventional current rectifying element. If the difference ($\Phi$A-$\Phi$B) in the barrier height is too large, then the applied voltage for flowing the ON-current becomes high. If the difference ($\Phi$A-$\Phi$B) in the barrier height is too small, then the effect of minimizing the OFF-current is reduced. Therefore, the difference in the barrier height ($\Phi$A-$\Phi$B) has a preferable range. In such a configuration, it is possible to achieve a current rectifying element which has a bidirectional and non-linear voltage-current characteristic with respect to the applied voltage and has a larger ON/OFF current ratio.

The barrier layer 11 of the current rectifying element 10 is desirably made of a semiconductor or insulator material. The barrier layer 11 desirably includes at least a layer made of silicon containing nitrogen, silicon containing carbon, or silicon containing oxygen.

Figure 7:
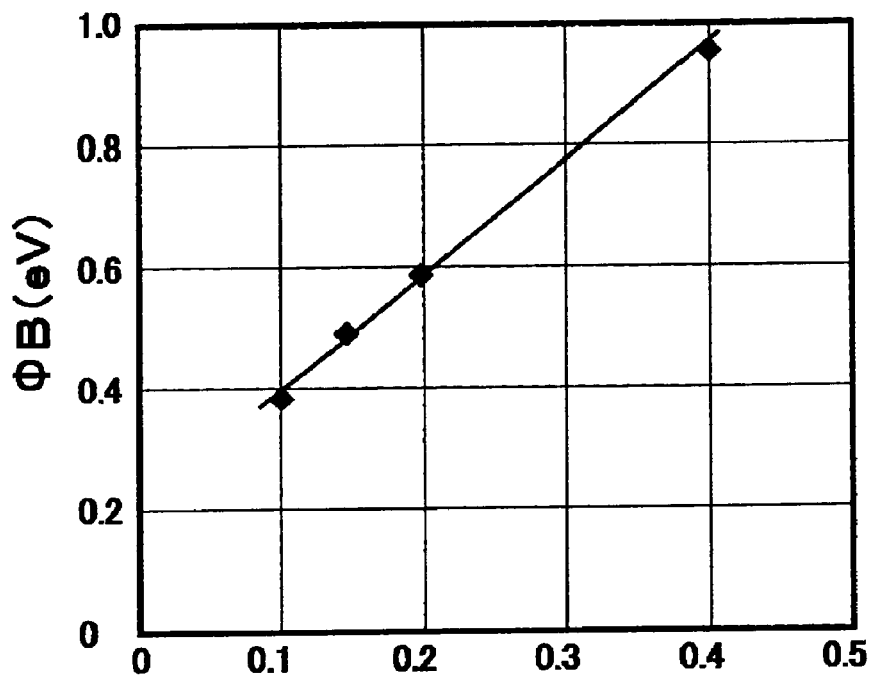
FIG. 7 is a view showing the relationship between a $N_2$ flow ratio and a barrier height ΦB in a deposition process of SiNx.

In such a configuration, a current rectifying element which has a bidirectional and non-linear voltage-current characteristic with respect to the applied voltage and has a large ON/OFF current ratio, is formed and achieved using a silicon-based material. By using the silicon-based material, a mass production process which is compatible with a semiconductor process adapted for miniaturization can be employed, and the current rectifying elements can be fabricated in a highly-productive process for fabricating an apparatus with high-dense integration Next, an example of a method of forming the above mentioned barrier layer using the silicon-based material will be described. FIG. 7 is a view showing the relationship between a $N_2$ flow ratio and a barrier height $\Phi$B in a deposition process of the SiNx layer which is a silicon layer containing nitrogen, for example. In FIG. 7, a horizontal axis indicates a mixing ratio of $N_2$ gas to Ar gas and a vertical axis indicates the barrier height of the region in the vicinity of the interface between SiNx deposited and each of the electrode layers of the current rectifying element sandwiching the SiNx layer.

The SiNx layer is deposited using, for example, reactive sputtering for depositing the SiNx layer by using a silicon target and by generating a reaction with $N_2$ gas. In this case, since Ar is used as a base gas used during the process of the reacting sputtering, the total gas flow rate is roughly determined by a sum of the Ar flow rate and the $N_2$ flow rate. As the electrode material of the electrode layers of the current rectifying element, for example, Pt is used.

As can be seen from FIG. 7, in the case where the electrode material is Pt, the barrier height increases substantially linearly with an increase in the mixing ratio of the $N_2$ gas to the total gas flow rate (Ar flow rate+$N_2$ flow rate). This means that as the content of N in the SiNx layer (content ratio of N, i.e., ratio of the amount of N atoms to the amount of Si atoms with the amount of Si atoms being 1 and the value of X in SiNx, the same occurs hereinafter) increases, the barrier height $\Phi$B increases correspondingly.

By making use of the fabrication condition of the SiNx layer as described above, for example, a large barrier height $\Phi$A is formed by increasing the $N_2$ gas flow rate with respect to the total gas flow rate, when the barrier layer 11a of the barrier layer 11 in FIG. 2(a), is deposited, while a barrier height ΦB which is smaller by a certain amount than ΦA is formed by reducing the $N_2$ gas flow rate with respect to the total gas flow rate when the barrier layers 11b and 11c are deposited. In this way, the barrier layer 11 of the current rectifying element 10 shown in FIG. 2(a) can be formed.

Figure 8:
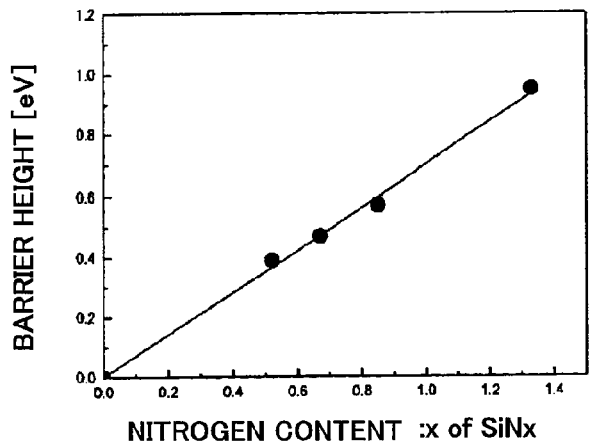
FIG. 8 is a view showing a nitrogen content dependency of the barrier height of the current rectifying element according to Embodiment 1 of the present invention.

FIG. 8 is a view showing the nitrogen content dependency of the barrier height formed at the $SiN_x$/Pt electrode interface thus fabricated. As shown, the barrier height and the nitrogen content of SiNx have a proportional relationship. From this, it should be understood that based on the relationship in FIG. 8, deposition of a SiNx layer with X=0.03 with respect to Si is sufficient, to make ΔE described with reference to FIG. 6 20 meV or larger, while deposition of a SiNx layer with X=0.31 is sufficient to make ΔE 220 meV or smaller. In other words, by forming a silicon layer containing nitrogen in which a nitrogen content difference between the center region of the barrier layer and the region in the vicinity of the interface is 0.03 or larger, ΔE reaches 20 meV or larger, and therefore, the OFF-current can be effectively reduced. And, by forming a silicon layer containing nitrogen in which a nitrogen content difference between the center region of the barrier layer and the region in the vicinity of the interface is 0.03 or larger and 0.31 or smaller, ΔE reaches 20 meV or larger and 220 meV or smaller. Therefore, it is possible to achieve a current rectifying element which is bidirectional and is capable of flowing an ON-current which is as high as the ON-current of the conventional current rectifying element and capable of making the above-mentioned ON-OFF current ratio larger than that of the conventional current rectifying element.

Figure 9:
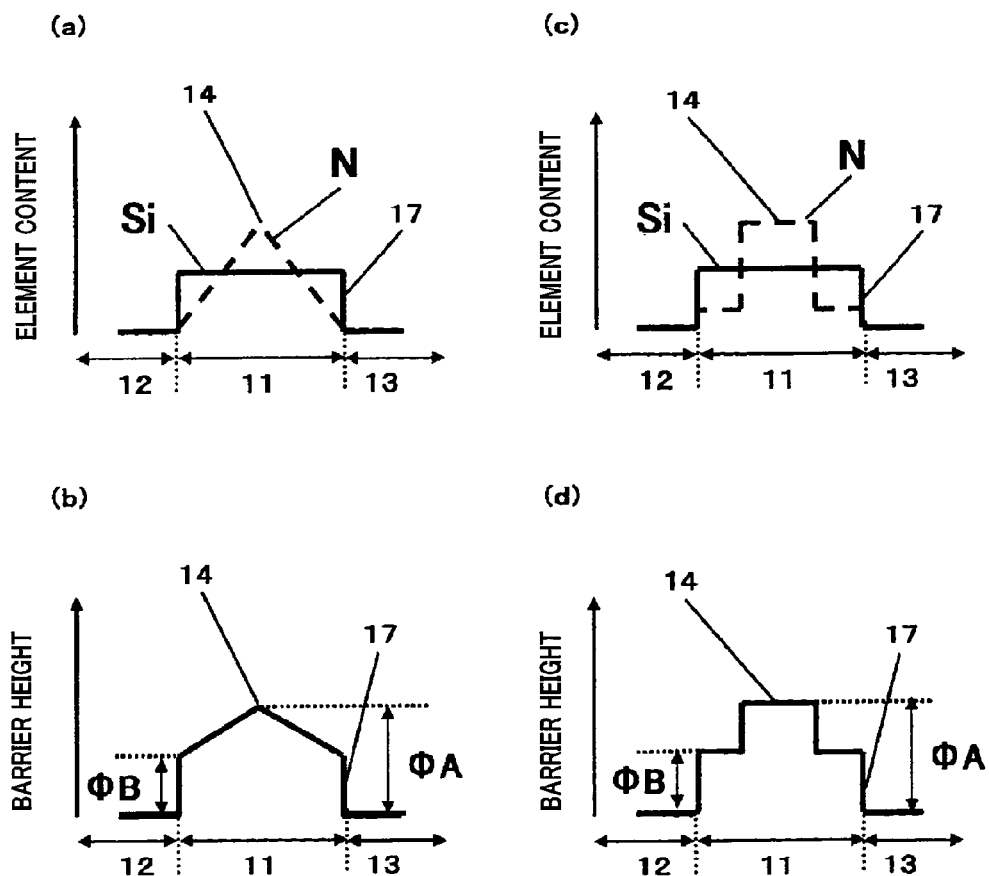

FIG. 9 is a schematic view showing content profiles of silicon (hereinafter expressed as Si) and nitrogen (hereinafter expressed as N) within the barrier layer 11 of the current rectifying element 10 and the shape of the barrier height of a SiN layer energy corresponding to the content profiles, in which FIG. 9(a) is a schematic view showing the content profiles of Si and N of the barrier layer 11 made of the SiN layer, in which Si indicates a uniform content profile within the barrier layer 11 and the N indicates a content profile increasing continuously from the region in the vicinity of the interface 17 to the center region 14. FIG. 9(b) is a schematic view showing the shape of the barrier height of the SiN layer corresponding to the content profiles of Si and N within the barrier layer 11. FIG. 9(b) schematically shows that the barrier height within the barrier layer 11 is ΦB and small in the region in the vicinity of the interface 17 and continuously increases to ΦA in the center region 14.

FIG. 9(c) is a schematic view showing the content profiles of Si and N of the barrier layer 11 made of the SiNx layer having a triple-layer structure of $SiN_{x1}$—$SiN_{x2}$—$SiN_{x1}$ (X1<X2). In the barrier layer shown in FIG. 9(c), Si indicates a uniform content profile within the barrier layer 11, and N indicates a stepwise content profile in which N is low in the region in the vicinity of the interface 17 and is high in the center region 14. FIG. 9(d) is a schematic view showing the barrier heights ΦA, ΦB and the shape of the barrier height corresponding to the content profile of N within the barrier layer 11. FIG. 9(d) shows a stepwise shape of the barrier height within the barrier layer 11 in which the barrier height is smaller in the vicinity of the interface of the electrode layer and is larger in the center region.

As exemplarily illustrated in FIG. 9, the barrier layer 11 of this embodiment may have a composition profile in which the content of at least one of nitrogen (N), carbon (C) and oxygen (hereinafter expressed as O) of the center region 14 is higher than the content of the region in the vicinity of the interface 17 in a stacking direction. Therefore, the composition profile may have a configuration in which the content of at least one of N, C, and O increases continuously from the region in the vicinity of the interface 17 to the center region 14 in the stacking direction. The barrier layer 11 may have a multilayer structure including at least three layers in which the content of at least one of N, C, and O is different. The composition profile of the barrier layer 11 may have a configuration in which the content of at least one of N, C and O increases in a stepwise manner from the region in the vicinity of the interface 17 to the center region 14 in the stacking direction.

In such a configuration, the current rectifying element having a bidirectional and non-linear voltage-current characteristic with respect to the applied voltage and has a large ON/OFF current ratio, is formed and achieved using a Si-based material. As described with reference to FIG. 2, since the barrier height is large in the center region 14 when the applied voltage is low, the OFF-current is effectively blocked and reduced.

Figure 10:
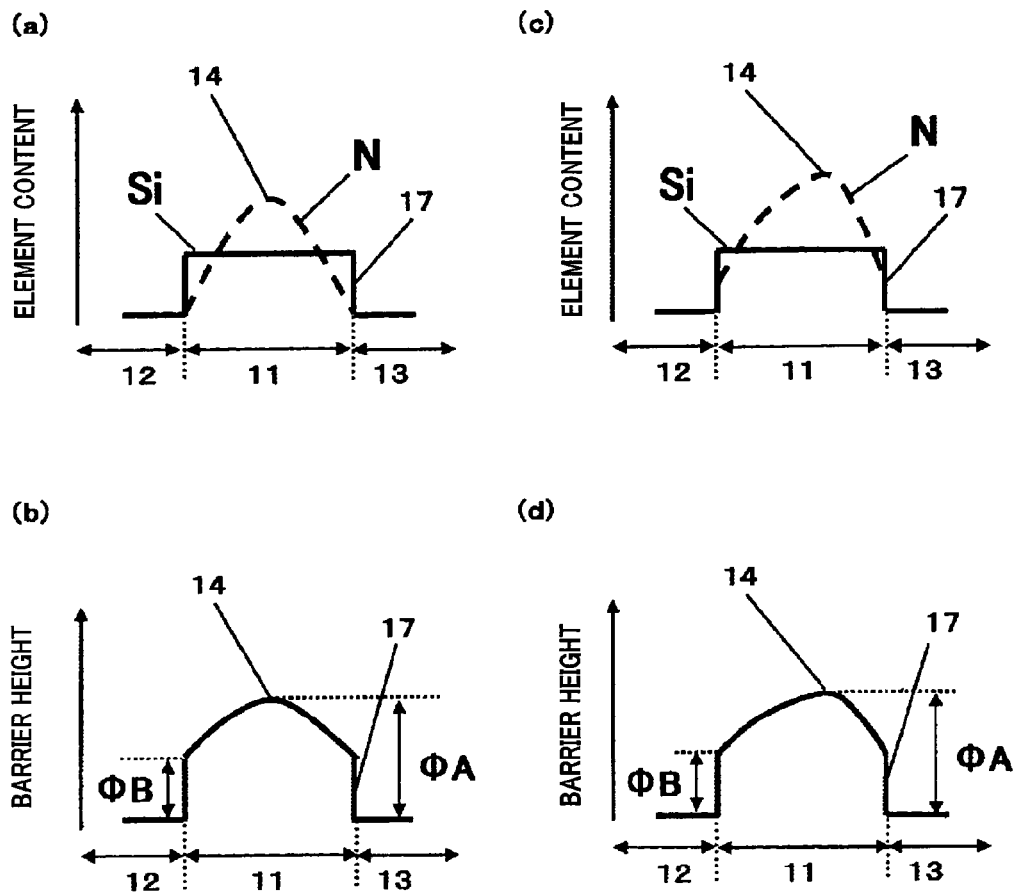

FIG. 10 is a schematic view showing content profiles of Si and N within the barrier layer 11 of the current rectifying element 10 and the shape of the barrier height of the SiN layer energy corresponding to the content profiles, similar to FIG. 9. FIGS. 10(a) and 10(c) are schematic views showing the content profiles of Si and N of the barrier layer 11 made of the SiNx layer, and FIGS. 10(b) and 10(d) are schematic views showing the shapes of the barrier heights of the SiN layer corresponding to the content profiles of Si and N within the barrier layer 11 shown in FIG. 10(a) and FIG. 10(c), respectively.

As shown in FIGS. 10(a) and 10(b), the content profile of N indicates a quadratic-function and curved change rather than a linear change as compared to the examples shown in FIGS. 9(a) and 9(b). FIGS. 10(c) and 10(d) each indicates that the peak of the content of N deviates from the center of the barrier layer 11.

Figure 11:
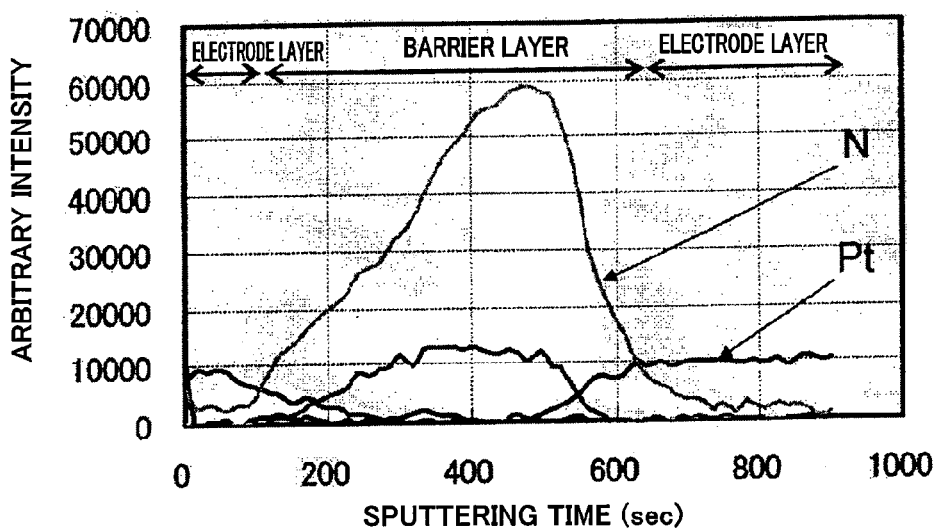
FIG. 11 is a view showing AES analysis measurement result of the content profile of N of the barrier layer.

FIG. 11 is a view showing AES analysis measurement result of the content profile of N of the barrier layer shown in FIG. 10(c) as an example, among the barrier layers shown in FIGS. 9 and 10. A horizontal axis indicates a sputtering time and a thickness from the surface of the sample analyzed by AES. That is, the positions of the electrode layer and the barrier layer depicted in the Figure respectively correspond to the positions of the associated respective layers. A vertical axis indicates intensity of the element to be analyzed, by an arbitrary intensity. As can be seen from FIG. 11, a change similar to a change in the content of N schematically shown in FIG. 10(c) is observed as intensity change indicating N within the barrier layer. As the analysis method, similar result is obtained using SIMS, TEM-EDX and TEM-EELS in analysis, instead of AES used in this embodiment.

Whereas in this embodiment, N has been described as an example of the material of the barrier layer, the barrier layer may be formed using C or O instead of N. As a material of the barrier layer, SiC or SiO may be used. That is, it is desired that the barrier layer material contain element A (A is nitrogen, carbon or oxygen) and silicon and the content ratio of the element A to silicon be larger in the center region in the thickness direction than in the region in the vicinity of the interface between each of the electrodes and the barrier layer, and the barrier height (height of the energy level of the barrier layer on the basis of the energy level of metal) of the center region in the thickness direction be larger than the barrier height of the region in the vicinity of the interface between each of the first and second electrode layers and the barrier layer.

To be specific, the barrier layer may be formed of a SiCx layer of a triple-layer structure of, for example, $SiC_{x1}$—

$SiC_{x2}$—$SiC_{x1}$ (X1<X 2). Or, the barrier layer may be formed of a SiOx layer of a triple-layer structure of, for example, $SiO_{x1}$—$SiO_{x2}$—$SiO_{x1}$ (X 1<X 2). The barrier layer may have a profile in which Si indicates a uniform content profile within the barrier layer, and C or O indicates a stepwise content profile in which C or O is lower in the region in the vicinity of the interface and is higher in the center region. In this case, the barrier height is lower in the region in the vicinity of the interface and is higher in the center region so as to correspond to the content profile of C or O within the barrier layer.

The fact that the barrier height increases with an increase in the content of C in SiCx is disclosed in FIG. 1 of Morimoto A. et. al., 1982, Journal of Applied Physics, vol. 53, pp. 7299-7305. The fact that the barrier height increases with an increase in the content of O in SiOx is disclosed in FIG. 4 of Bacioglu, A. et al., 2005, Solar Energy Materials & Solar Cells, vol. 89, pp. 49-59.

Whereas the barrier layer is described as having element composition profile of the triple-layer structure, the structure is not limited to the triple-layer structure but may be a four or more layer structure, instead of the triple-layer structure.

In many cases, the resistance variable layer requires a high current to switch resistance. In those cases, it is desirable to use a MSM diode in which a band gap of the barrier layer is small, as a bidirectional current steering element. The MSM diode may be formed by sandwiching the barrier layer made of SiNx, SiCx, or SiOx between metal electrodes. Such a structure is particularly suitable in the case where resistance variable elements which require a high current are incorporated into a memory device.

Embodiment 2

Figure 12:
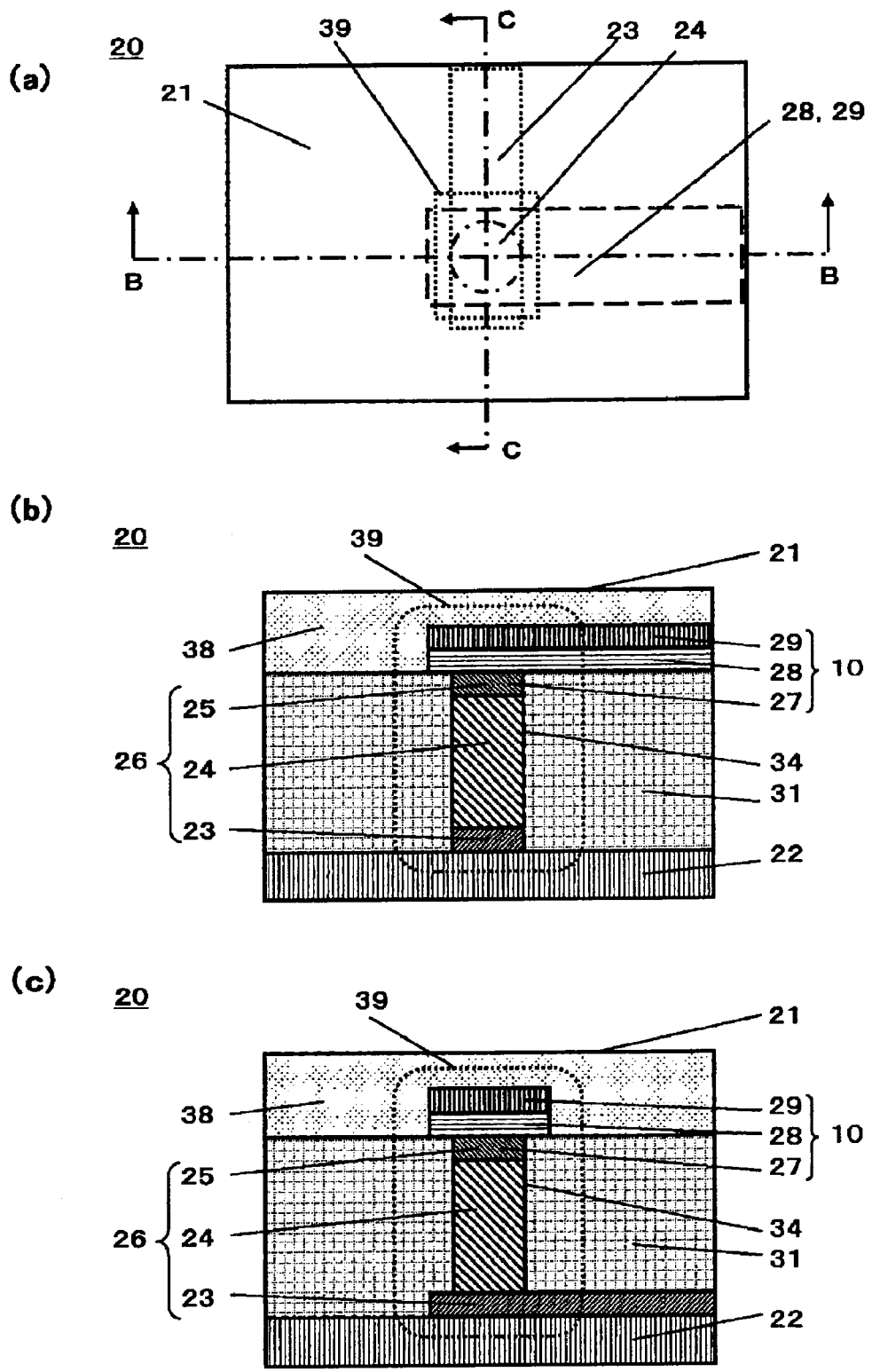

FIG. 12 is a view of a schematic configuration of a memory device 20 according to Embodiment 2 of the present invention. FIG. 12(a) is a view showing the schematic configuration of the memory device 20 as viewed from a semiconductor chip surface 21 and FIG. 12(b) is a schematic cross-sectional view taken in the direction of arrows along line B-B of FIGS. 12(a) and 12(c) is a schematic cross-sectional view taken in the direction of arrows along line C-C of FIG. 12(a).

In the memory device 20 of FIG. 12(a), a resistance variable layer 24 is disposed on a lower electrode 23 in the stacking direction, and the current rectifying element 10 with a large ON-OFF current ratio described in Embodiment 1 is disposed thereabove.

The memory device 20 shown in FIG. 12(b) and FIG. 12(c) includes a memory element 39 including a lower electrode 23 formed on a substrate 22, an upper electrode 25 and the resistance variable layer 24 sandwiched between the lower electrode 23 and the upper electrode 25. When the memory device includes plural memory elements, the memory elements 39 are incorporated thereinto as memory cells. The memory element 39 is configured to include the resistance variable layer 24 sandwiched between the lower electrode 23 and a second electrode layer 29, and the current rectifying element 10 illustrated in Embodiment 1 which is electrically connected to the upper side or lower side of the resistance variable layer 24. In the example shown in FIGS. 12(b) and 12(c), the current rectifying element 10 is disposed on and connected to the upper side of the resistance variable layer 24 and the upper side of the current rectifying element 10 is covered with a second interlayer insulating layer 38.

In this embodiment, the memory element 39 includes on the substrate 22, a resistance variable element 26 in which the resistance variable layer 24 made of a metal oxide material is sandwiched between the upper electrode 25 and the lower electrode 23 and the current rectifying element 10 which is connected to the resistance variable element 26 and in which the barrier layer 28 having a triple-layer structure of $SiN_{x1}$—$SiN_{x2}$—$SiN_{x1}$ (X1<X2) described in Embodiment 1 is sandwiched between a first electrode layer 27 at a lower side and a second electrode layer 29 at an upper side. In this embodiment, as shown in FIGS. 12(b) and 12(c), the upper electrode 25 and the first electrode layer 27 are formed by a common electrode.

In the configuration of the memory element 39 shown in FIG. 12, the resistance variable layer 24 is embedded in a contact hole 34 with an about 0.1 μm diameter and is disposed on the lower electrode 23. The contact hole 34 is located at the upper side of the lower electrode 23 so as to expose the lower electrode 23 and penetrates through a first interlayer insulating layer 31 formed over the lower electrode 23. The upper electrode 25 of the resistance variable element 26 is embedded in the contact hole 34 such that the upper electrode 25 is disposed on the resistance variable layer 24.

In such a configuration, since the resistance variable layer is embedded in the contact hole, it is electrically isolated from its adjacent memory elements and is capable of stably repeating resistance switching without crosstalk. Further, since the current rectifying element can be formed on the resistance variable layer in a self-aligned manner and in an electrically-isolated manner, and memory elements which are integrated with high density and do not cause crosstalk is achieved.

Next, the operation of the memory element 39 will be described with reference to the configuration of FIG. 12.

Figure 13:
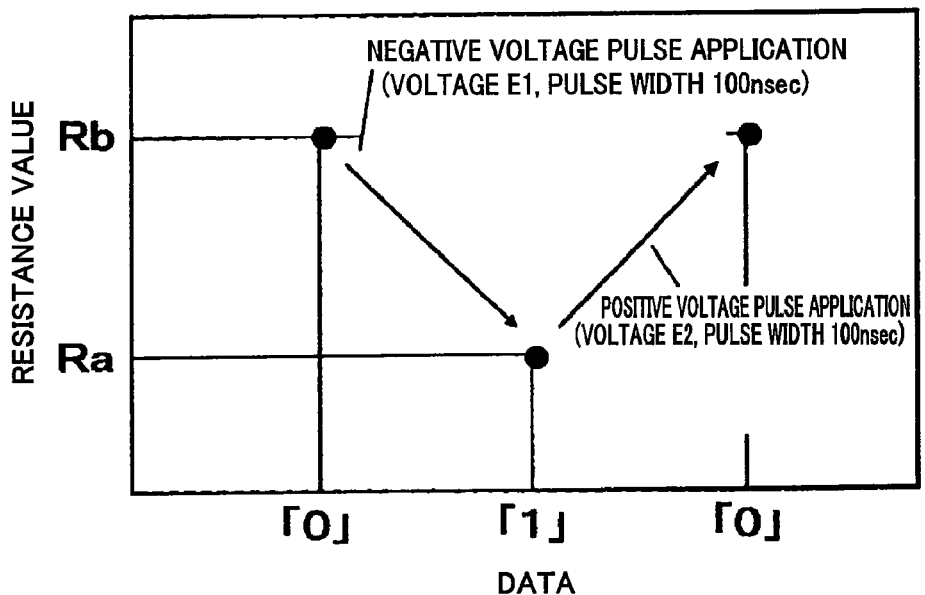
FIG. 13 is a view showing a change in a resistance value which occurs when an electrical pulse is applied to a resistance variable element of a memory device according to Embodiment 2 of the present invention.

FIG. 13 is a view showing switching of a resistance value which occurs when an electrical pulse is applied to the resistance variable element 26 of the memory element 39 fabricated with the structure of the schematic cross-sectional views shown in FIGS. 12(b) and 12(c). It should be noted that the resistance value of the resistance variable element 26 varies in an initial stage of start of measurement immediately after fabricating the resistance variable element 26, and therefore the resistance value of the resistance variable element 26 after the operation for making the resistance value substantially constant is performed is shown.

When two kinds of electrical pulses having different polarities and a pulse width of 100 nsec are applied alternately between the lower electrode 23 of the resistance variable element 26 of the memory element 39 and the second electrode layer 29 of the current rectifying element 10, the resistance value of the resistance variable element 26 sandwiched between the electrodes switches as shown in FIG. 13. To be specific, as shown in FIG. 13, when a negative voltage pulse (e.g., voltage E1, pulse width 100 nsec) is applied, the resistance value decreases to a low-resistance value Ra of $2.5 \times 10^3 \Omega$. On the other hand, when a positive voltage pulse (e.g., voltage E2, pulse width 100 nsec) is applied, the resistance value increases to a high-resistance value Rb of $1.1 \times 10^4 \Omega$ In this case, the electrical pulse is applied to a desired resistance variable element 26 which requires switching of the resistance value by dividing the voltage such that the negative voltage is −2.7V and the positive voltage is +3.7V. As a result, the resistance value of the desired resistance variable element 26 is stably rewritten.

As shown in FIG. 13, one of the resistance values of the resistance variable element 26, i.e., the two different resistance values Ra and Rb, is assigned to data "0" and the other is assigned to data "1." Thereby, data "0" or data "1" is read based on whether the resistance value is "Ra" or "Rb." In the example shown in FIG. 13, the high-resistance value Rb is assigned to data "0" and the low-resistance value Ra is assigned to data "1." As shown in FIG. 13, when the negative voltage pulse is applied in the state where the resistance value of the resistance variable element 26 is Rb, the resistance value Ra is stored, and data of the resistance variable element 26 is rewritten from "0" to "1." Likewise, when the positive voltage pulse is applied in the state where the resistance value of the resistance variable element 26 is Ra, the resistance value Rb is stored, and data of the resistance variable element 26 is rewritten from "1" to "0."

Figure 14:
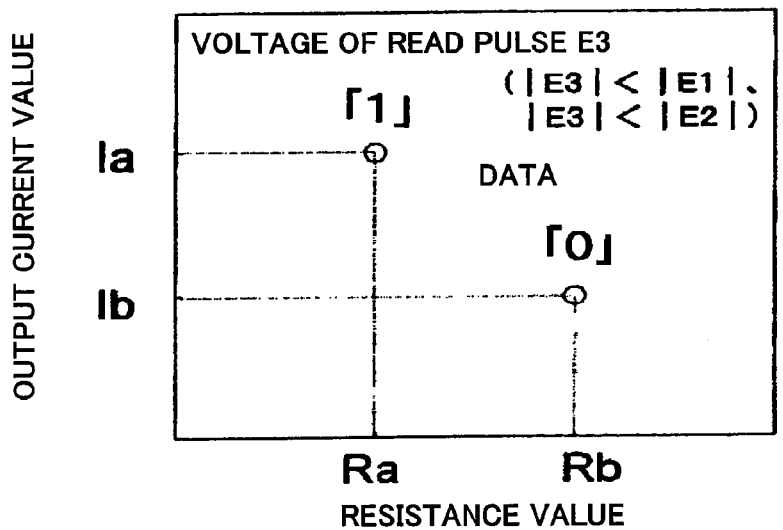
FIG. 14 is a view showing the relationship between two different resistance values and data "0" and data "1."

When reading data, a reproducing voltage E3 with a smaller amplitude than the electrical pulse applied to switch the resistance value of the resistance variable element 26, is applied to the resistance variable element 26, and an output current value corresponding to the resistance value shown in FIG. 14 is read. Since the output current value Ia or Ib corresponds to the resistance value Ra or Rb, respectively, the data "0" or the data "1" is read as shown in FIG. 14. In the above described manner, the memory element 39 operates.

The current rectifying element 10 forming a part of the memory element 39 operating in the above described manner is a current rectifying element having the same structure as the current rectifying element described in Embodiment 1. In this embodiment, description will be given using as an example, the current rectifying element 10 in which the barrier layer 28 shown in FIGS. 12(b) and 12(c) has a triple-layer structure of $SiN_{x1}$—$SiN_{x2}$—$SiN_{x1}$ (X1<X2). By forming the current rectifying element 10 with such a structure, the current rectifying element 10 which has a barrier height of a stepped convex shape, a large ON/OFF current ratio and a bidirectional and nonlinear voltage-current characteristic can be achieved. As a result, the memory element 39 operates as a memory cell which is capable of a bidirectional memory operation and has a high ON-current and a large ON/OFF current ratio.

Figure 15:
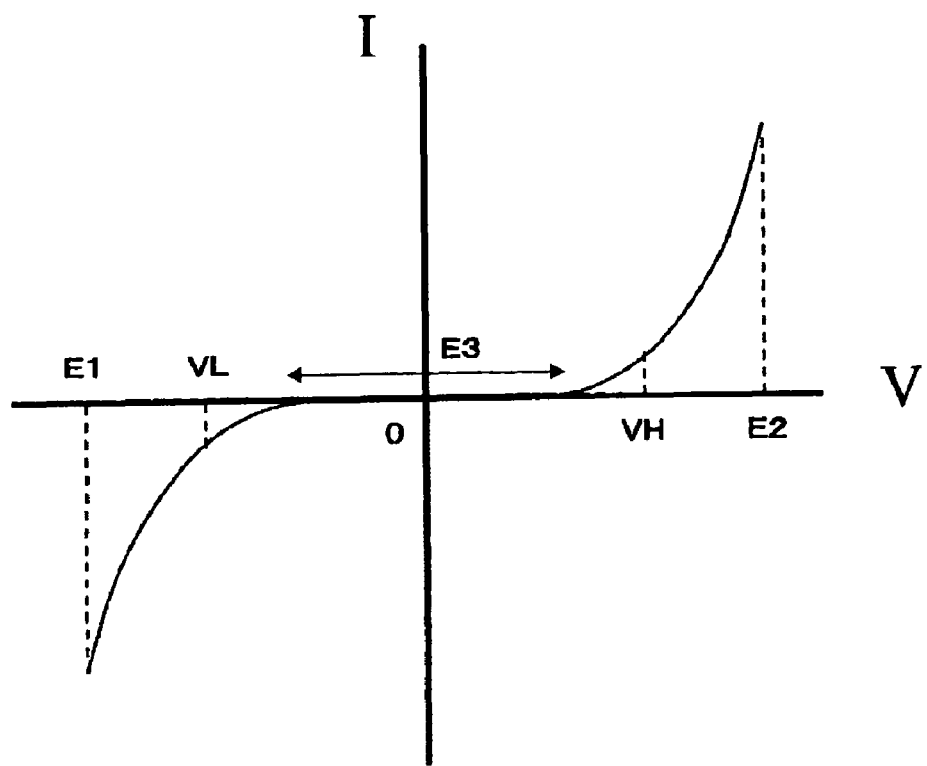
FIG. 15 is a view showing a current-voltage characteristic of a current rectifying element according to Embodiment 2 of the present invention.

FIG. 15 is a view schematically showing a current-voltage characteristic (I-V characteristic) of the current rectifying element 10. In the example of FIG. 15, the resistance value of the resistance variable element 26 in a case where a positive voltage pulse is smaller than VH or a negative voltage pulse is smaller than VL (in absolute value) is the high-resistance value Rb, while the resistance value of the resistance variable element 26 in a case where a positive voltage pulse is larger than VH or a negative voltage pulse is larger than VL (in absolute value) is the low-resistance value Ra. The reproducing voltage E3 used for reading the resistance value to read data is applied with a magnitude between VH and VL in FIG. 15.

As can be seen from the I-V characteristic of the current rectifying element which is shown in FIG. 15, the current rectifying element is placed into a low-resistance when a high positive or negative voltage is applied to the current rectifying element, whereas the current rectifying element is placed into a high-resistance when a low voltage which is not larger than VH and VL is applied to the current rectifying element. By making use of this characteristic, the memory element 39 of this embodiment is applied with a voltage in the configuration in which the resistance variable element 26 is connected in series to the current rectifying element 10. When the reproducing voltage E3 is applied, a relatively large part of the reproducing voltage E3 is applied to the current rectifying element, because the current rectifying element is in a high-resistance state. On the other hand, when a high positive voltage E2 or a high negative voltage E1 is applied, a larger part of the positive voltage E2 or a large part of the negative voltage E1 is applied to the resistance variable element 26, because the current rectifying element is in the low-resistance state. Therefore, it is possible to rewrite the resistance value by applying a voltage with a proper magnitude to the memory element. When the reproducing voltage E3 is applied to the memory element to read the resistance value, the resistance value can be read stably without rewriting the resistance value inadvertently even if a noise or the like is superposed on the reproducing voltage E3.

Since the current rectifying element is connected in series to the resistance variable element in the memory element of this embodiment, write disturb can be prevented. The memory element in which the resistance variable element is connected in series to the current rectifying element, is in the high-resistance state, when reading and writing of data is not performed, because no voltage is applied to the current rectifying element. In this memory element, therefore, the resistance variable element can be further protected from an electrical noise or crosstalk, as compared to a memory element consisting of the resistance variable element. Furthermore, when writing data, a voltage with an invariable magnitude which is dropped invariably by the current rectifying element is applied to the resistance variable element, it is possible to surely prevent an event that a high voltage is applied to the resistance variable element and inadvertent rewriting occurs. Therefore, the memory element with high reliability is achieved.

Figure 16:
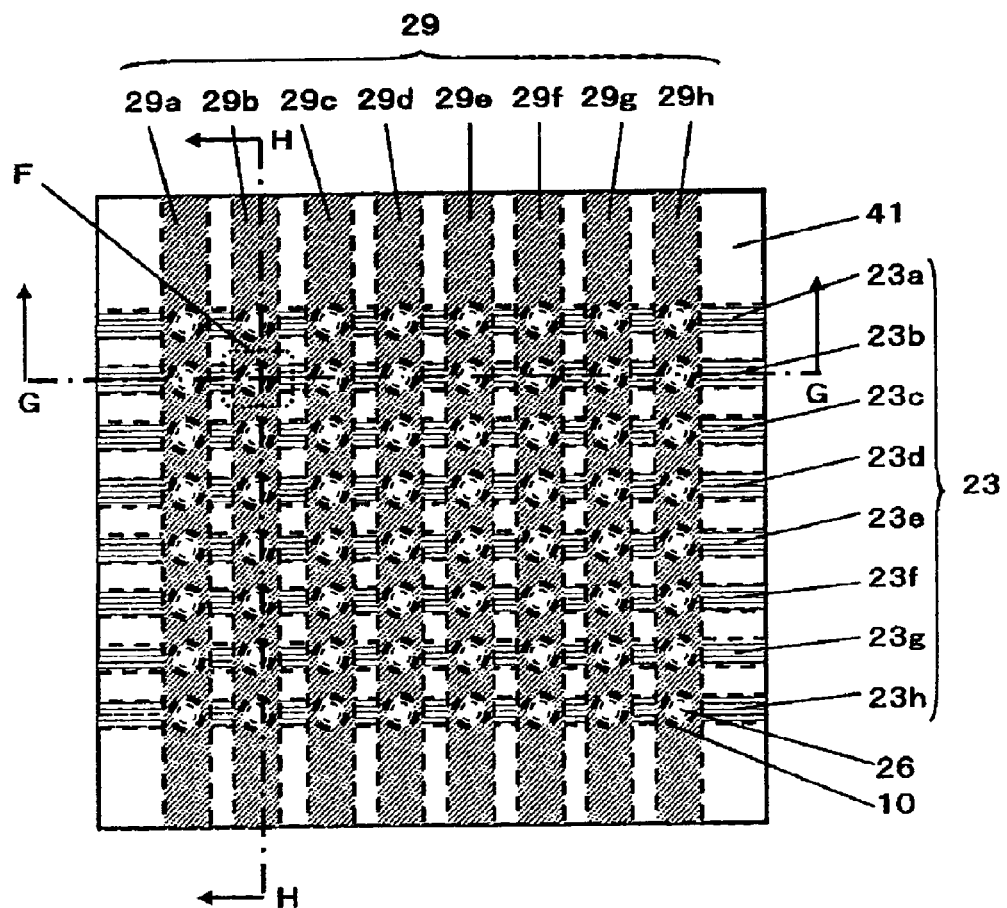
FIG. 16 is a view of a schematic configuration of a cross-point memory device according to Embodiment 2 of the present invention.
Figure 17:
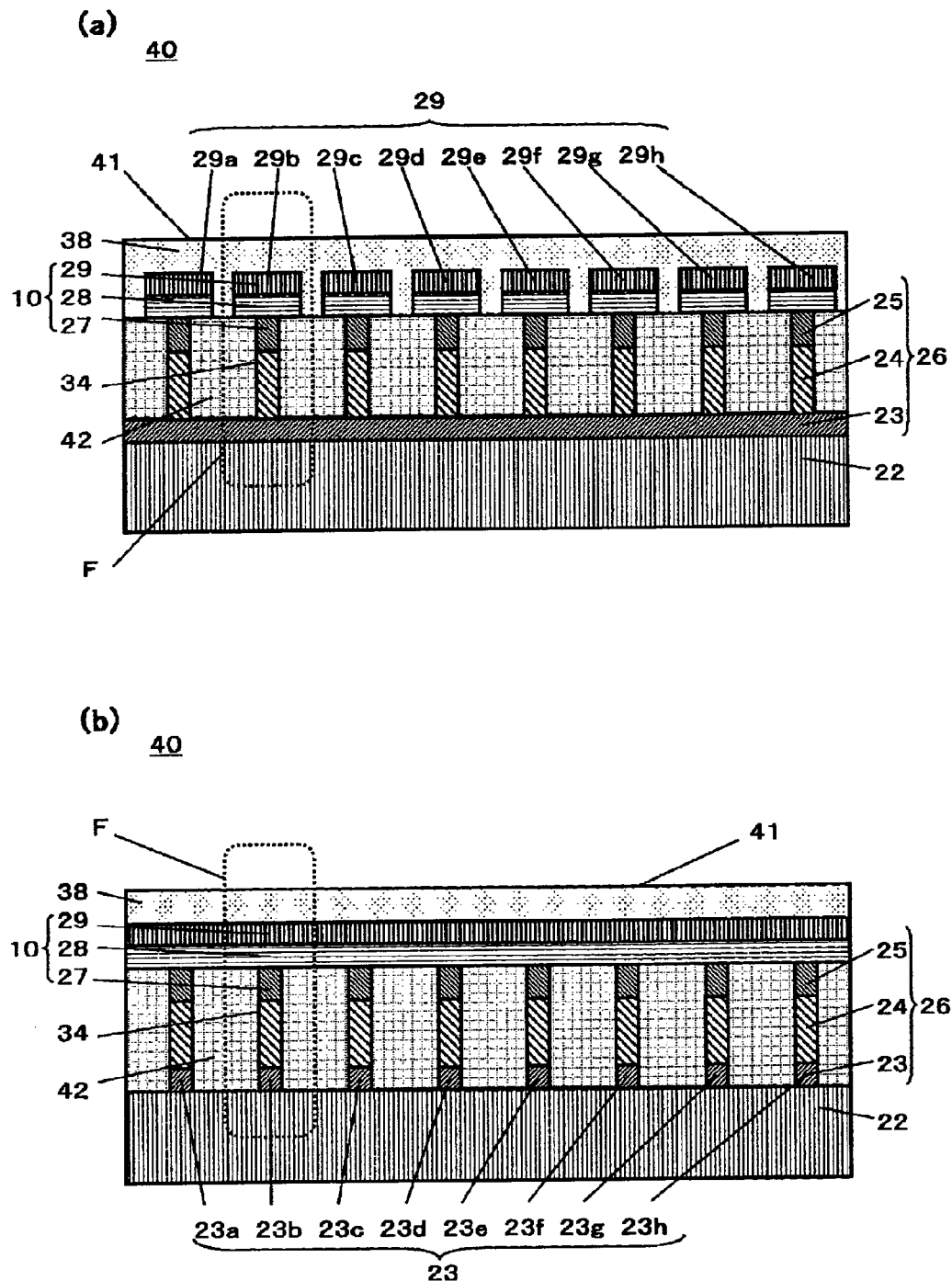

FIGS. 16 and 17 are views showing the configuration of a cross-point memory device 40 and showing a schematic configuration as viewed from a semiconductor chip surface 41. The memory device 40 of FIG. 16 has a configuration in which memory cells F having the same structure as the memory element 39 of FIGS. 12(b) and 12(c) are arranged in a cross-point form. As shown in FIG. 16, the lower electrode 23 formed on a substrate (not shown), and a stripe-shaped second electrode layer 29 crossing the lower electrode 23 at a right angle sandwich the resistance variable element 26 and the current rectifying element 10. With such a configuration, it is possible to achieve a memory cell F which can prevent write disturb, can be driven with a great current drivability, and includes a current rectifying element having a bidirectional and non-linear voltage-current characteristic with respect to the applied voltage and has a large ON/OFF current ratio.

In FIG. 16, for example, eight lower electrodes 23 (23a, 23b, 23c, 23d, 23e, 23f, 23g, 23h) and eight second electrode layers 29 (29a, 29b, 29c, 29d, 29e, 29f, 29g, 29h) are illustrated. At each of the cross portions of these electrodes, the resistance variable element 26 and the current rectifying element 10 are sandwiched between the associated lower electrode 23 and the associated second electrode layer 29, forming the memory cell F. In an entire configuration, plural memory cells F are arranged in matrix. In other words, the resistance variable layers (not shown) of the memory cells F are sandwiched between the stripe-shaped lower electrodes 23 and the stripe-shaped second electrode layers 29 and the lower electrodes 23 cross the second electrode layers 29, respectively.

FIG. 17(a) is a schematic cross-sectional view of the memory device 40 taken in the direction of arrows along line G-G of FIG. 16, and FIG. 17(b) is a schematic cross-sectional view of the memory device 40 taken in the direction of arrows along line G-G of FIG. 16. In an area defined by a broken line shown in FIG. 17(a), the memory cell F of the memory device 40 which has a configuration similar to that of the memory element 39 of FIGS. 12(b) and 12(c) is illustrated. As shown in FIGS. 17(a) and 17(b), eight memory cells F are arranged.

As shown in FIG. 16, and FIGS. 17(a) and 17(b), the cross-point memory device 40 of this embodiment is configured to include, the memory elements F each including the lower electrode 23 formed on the substrate 22, the upper electrode 25 and the resistance variable layer 24 sandwiched between the lower electrode 23 and the upper electrode 25. The lower electrode 23 is formed in a stripe shape on the substrate 22. The second electrode layer 29 is stripe-shaped and cross the lower electrode 23 via an element interlayer insulating layer 42 formed on the substrate 22 and the lower electrode 23. The memory device 40 is configured such that the current rectifying element 10 described in Embodiment 1 is electrically connected in series to the upper side or the lower side of the resistance variable layer 24 at each cross portion where the lower electrode 23 and the second electrode layer 29 in the memory element F cross each other.

In the memory device shown in FIGS. 12, 16 and 17, the resistance variable layer is configured to perform a memory operation in such a manner that the resistance variable layer switches to a low-resistance state in response to a positive voltage applied and switches to a high-resistance state in response to a negative voltage applied, or the resistance variable layer switches to the high-resistance state in response to the positive voltage applied and switches to the low-resistance state in response to the negative voltage applied.

To be specific, in the memory device 40 of FIGS. 16 and 17, as in the configuration of FIG. 12, the electrical pulse of the positive voltage or the negative voltage is applied to the lower electrode 23 through the second electrode layer 29 via the current rectifying element 10, and in response to the electrical pulse applied, the resistance variable layer 24 in each of the plural memory cells F exhibits a characteristic in which its resistance value increases or decreases. By switching of the resistance value, data is stored or read as in the memory device 20 of FIG. 12.

In such a configuration, since the current rectifying element which has a large ON/OFF current ratio and is bidirectional is connected in series to the resistance variable element, to form the memory cell incorporated into the memory device, it is possible to achieve a highly reliable cross-point memory device which operates stably without write disturb due to a bypass current from adjacent memory cells and without influence of a noise or crosstalk. In addition, this memory device is operable in response to either one of the positive voltage and the negative voltage, as a bidirectional memory device.

The resistance variable layer 24 may be configured to include at least a tantalum oxide such as TaO and to switch the resistance value reversibly in response to an electrical signal applied between the lower electrode 23 and the second electrode layer 29.

With such a configuration, since the memory cell including the resistance variable layer is capable of performing a memory operation stably, a stable memory device is achieved.

The current rectifying element 10 may be configured to steer a current bidirectionally (restricting a current in a low-voltage range) in response to an electrical signal applied between the lower electrode 23 and second electrode layer 29. In other words, the current rectifying element 10 may be configured to have the same structure as, for example, the current rectifying element 10 shown in FIGS. 2(a), 2(b), and 2(c) described in Embodiment 1.

With such a configuration, it is possible to achieve a highly reliable memory device 40 which is operable bidirectionally and stably without write disturb due to a bypass current from adjacent memory cells and without influence of a noise or crosstalk.

Figure 18:
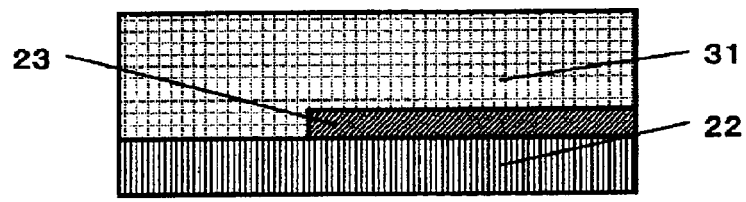
FIGS. 18(a) to 18(d) are schematic cross-sectional views showing a fabrication method (process flow of an earlier-half part) of the memory device according to Embodiment 2 of the present invention.
Figure 18:
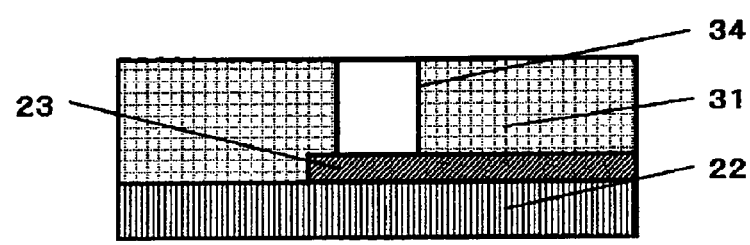
Figure 18:
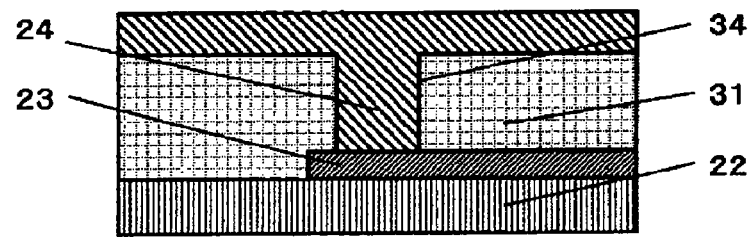
Figure 18:
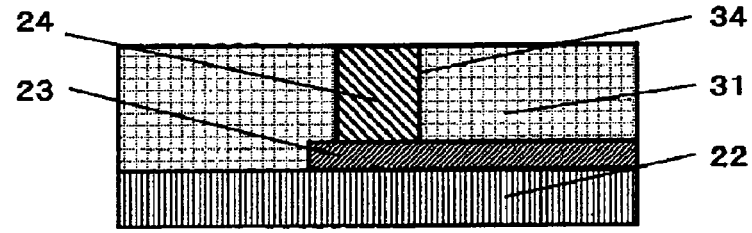
Figure 19:
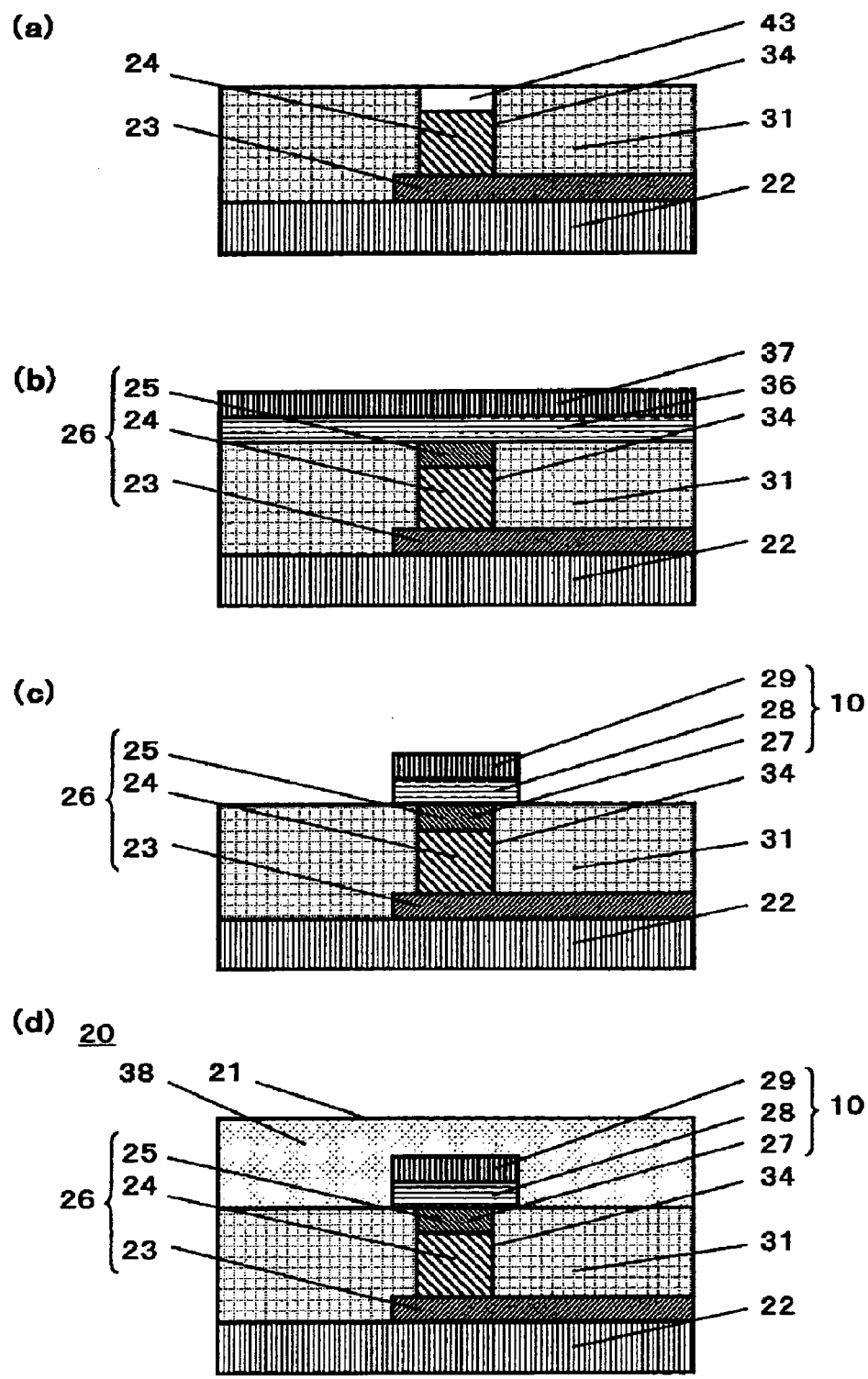
FIGS. 19(a) to 19(d) are schematic cross-sectional views showing a fabrication method (process flow of a later-half part) of the memory device according to Embodiment 2 of the present invention.

Next, a fabrication method of the current rectifying element and the memory device according to this embodiment will be described. As shown in FIGS. 18 and 19, the fabrication method of the cross-point memory device 20 of this embodiment includes a step for forming the stripe-shaped lower electrode 23 shown in FIG. 16 and FIG. 17(b) on the substrate 22, a step for forming the element interlayer insulating layer 31 on the substrate 22 and the lower electrode 23, and a step for forming the contact hole 34 which penetrates through the element interlayer insulating layer 31 on the lower electrode 23 and exposes the lower electrode 23. The fabrication method of the memory device 20 includes a step for embedding the resistance variable layer 24 in the contact hole 34, a step for forming the current rectifying element 10 including the first electrode layer 27, the second electrode layer 29 and the barrier layer 28 sandwiched between the first electrode layer 27 and the second electrode layer 29 such that the current rectifying element 10 covers the resistance variable layer 24 and is electrically connected in series to the resistance variable layer 24, and a step for forming the second electrode layer 29 such that the second electrode layer 29 is electrically connected to the upper electrode 25, and crosses the lower electrode 23 in a stripe shape. In the fabrication method of the memory device 20, the barrier layer 28 of the current rectifying element 10 is formed such that the element content of the material of the center region in the thickness direction sandwiched between the first electrode layer 27 and the second electrode layer 29 is different from the element content of the material of the regions in the vicinity of the interface between the barrier layer 28 and the first electrode layer 27 and the interface between the barrier layer 28 and the second electrode layer 29 so that the barrier height of the material of the center region is larger than the barrier height of the material of the region in the vicinity of the interface.

With such a method, a highly reliable memory device which is operable bidirectionally and stably without write disturb due to a bypass current from adjacent memory cells and without influence of a noise or crosstalk can be fabricated using a mass-production process which is compatible with a semiconductor process adapted for miniaturization.

Next, a process flow of the fabrication method of the memory device 20 of this embodiment, for example, the memory device 20 described with reference to FIG. 12, will be described with reference to FIGS. 18 and 19. FIGS. 18 and 19 show a series of process flow. FIG. 18 shows an earlier-half process flow and FIG. 19 shows a later-half process flow.

As shown in FIG. 18(a), the lower electrode 23 made of Al is formed on, for example, the Si substrate 22 so as to have a 0.1 μm width and a 0.1 μm thickness and so as to extend in a specified direction, by a deposition process and an etching process. Then, by a CVD process or the like, a 250 nm-thick oxide layer is deposited as the first interlayer insulating layer 31 so as to cover the substrate 22 and the lower electrode 23.

Then, as shown in FIG. 18(b), by, for example, a dry etching process, the contact hole 34 of a 80 nm diameter is formed so as to penetrate through the first interlayer insulating layer 31 on the lower electrode 23. Then, an oxide layer material of transition metal is filled into the contact hole 34 by the sputtering process, thereby forming the resistance variable layer 24 such that the resistance variable material made of, for example, a tantalum oxide such as TaO is filled into the contact hole 24 and is deposited in a layer form on the first interlayer insulating layer 31, as shown in FIG. 18(c).

Then, as shown in FIG. 18(d), the resistance variable layer 24 deposited on the first interlayer insulating layer 31 is removed by CMP (chemical mechanical polishing) technique so as to expose the surface of the first interlayer insulating layer 31, leaving only a portion of the resistance variable layer 24 deposited in the contact hole 34.

Then, as shown in FIG. 19(a), the upper portion of the resistance variable layer 24 in the contact hole 34 is removed by the CMP technique, forming a recess of a 30 nm depth. Then, an electrode material made of, for example, tantalum nitride such as TaN is filled into the recess 43 so as to form a layer of the electrode material on the first interlayer insulating layer 31 as a material of the upper electrode 25. Thereafter, the electrode material on the first interlayer insulating layer 31 is removed by the CMP technique. It should be noted that the TaN layer is formed so as to serve as the upper electrode layer 25 and as the first electrode layer 27 of the current rectifying element 10.

Then, as shown in FIG. 19(b), by controlling the flow ratio of $N_2$ gas to (Ar gas+$N_2$ gas) shown in FIG. 7 of Embodiment 1 in, for example, a reactive sputtering process, a SiN layer 36 is formed on the upper electrode 25 and the first interlayer insulating layer 31 so as to include three layers of $SiN_{x1}$—$SiN_{x2}$—$SiN_{x1}$ (X1<X2) and so as to have a larger N content in a center layer than in other layers. Then, a 0.1 m-thick layer of Al is formed as the Al electrode layer 37 on the SiN layer 36. Then, as shown in FIG. 19(c), the barrier layer 28 of the SiN layer including three layers of $SiN_{x1}$—$SiN_{x2}$—$SiN_{x1}$ which has a 180 nm width and stripe shape, and the second electrode layer 29 made of Al are formed so as to cover the upper electrode 25. Thus, the current rectifying element 10 is fabricated.

Then, as shown in FIG. 19(d), a second interlayer insulating layer 38 is formed on the first interlayer insulating layer 31 as a 0.4 μm-thick oxide layer so as to cover the barrier layer 28 and the second electrode layer 29, by the CVD process or the like. In this manner, the memory device 20 is fabricated. The current rectifying element 10 is formed on the resistance variable element 26 such that the current rectifying element 10 is connected in series to the resistance variable element 26 in a stacking direction.

The fabrication method of the current rectifying element 10 includes a barrier layer forming step for forming the barrier layer 28 on the first electrode layer 27 or the second electrode layer 29 and a step for forming the second electrode layer 29 or the first electrode layer 27 on the barrier layer 28. By changing partial pressures of plural gases, for example, partial pressures of Ar gas and $N_2$ gas in the barrier layer forming step, the barrier layer 28 has a barrier height profile which is larger in the center region than in the region in the vicinity of the interface between each of the first and second electrodes layers and the barrier layer as described in Embodiment 1.

Through the above mentioned process flow, the memory device 20 is fabricated. It should be noted that the memory device 40 shown in FIGS. 18 and 19 in which the memory cells F are arranged in matrix can be fabricated by a similar fabrication method. The fabrication process illustrated in this embodiment uses a mask process identical to a semiconductor planar process such as a CMOS process adapted for miniaturization and does not use a special semiconductor process peculiar to this embodiment in fabrication of the resistance variable layer 24 and the barrier layer 28. Therefore, it is possible to fabricate the resistance variable layer 24 with a method which is compatible with the semiconductor process adapted for further miniaturization and with a minimum size of a process rule used, for example, a process rule less than 100 nm.

By fabricating the memory device using such a method, it is possible to fabricate a highly reliable memory device which is operable bidirectionally and stably without write disturb due to a bypass current from adjacent memory cells and without influence of a noise or crosstalk using a mass-production process which is compatible with a semiconductor process adapted for miniaturization. In addition, since the memory cell is fabricated to include the current rectifying element having a bidirectional and nonlinear voltage-current characteristic, the memory device is operable bidirectionally so as to exhibit a high ON-current and a large ON-OFF current ratio.

The barrier layer 28 may be formed such that the element content of the material of the center region in the thickness direction is different from the element content of the material of the region in the vicinity of the interface so that a difference in barrier height between the center region and the region in the vicinity of the interface is 20 meV or larger. With such a method, it is possible to fabricate a memory device incorporating the current rectifying element having a bidirectional and non-linear voltage-current characteristic with respect to an applied voltage and having a larger ON/OFF current ratio. In addition, it is possible to fabricate a memory device including the resistance variable element using the resistance variable layer and the bidirectional current rectifying element which is most suitable as, for example, the current rectifying element connected in series to the resistance variable element.

The barrier layer 28 may be formed such that the element content of the material of the center region is different from the element content of the material of the region in the vicinity of the interface so that a difference in barrier height between the center region and the region in the vicinity of the interface is 20 meV or larger and 220 meV or smaller. In such a configuration, since the ON/OFF current ratio of the current rectifying element can be made maximum within a range of the voltage applied for a write operation and a read operation of the memory cell, it is possible to achieve a highly reliable memory device which is operable stably without write disturb due to a bypass current from adjacent memory cells and without influence of a noise or crosstalk. The memory device can be fabricated using a mass-production process which is compatible with a semiconductor process adapted for miniaturization.

The barrier layer may be formed to have a composition profile in which a content of one of nitrogen, carbon and oxygen is higher in the center region than the region in the vicinity of the interface in the stacking direction. The profile of the element content may be such that the element content increases continuously or in a stepwise manner so that the element content of the center region is higher. With such a method, it is possible to fabricate a highly reliable memory device which operates stably without write disturb due to a bypass current from adjacent memory cells and without influence of a noise or crosstalk using a mass-production process which is compatible with a semiconductor process adapted for miniaturization.

The barrier layer may be formed to have a multi-layer structure including at least three layers in which a content of one of nitrogen, carbon and oxygen is different, and have a composition profile in which the contents of nitrogen, carbon, and oxygen increase in height in a stepwise manner from the region in the vicinity of the interface to the center region in the stacking direction. With such a method, it is possible to fabricate a highly reliable memory device which operates stably without write disturb due to a bypass current from adjacent memory cells and without influence of a noise or crosstalk using a mass-production process which is compatible with a semiconductor process adapted for miniaturization.

At least one of the first electrode layer and the second electrode layer may be at least one layer selected from among TiAlN, TiN, TaN, TaAlN, and TaSiN.

Embodiment 3

Figure 20:
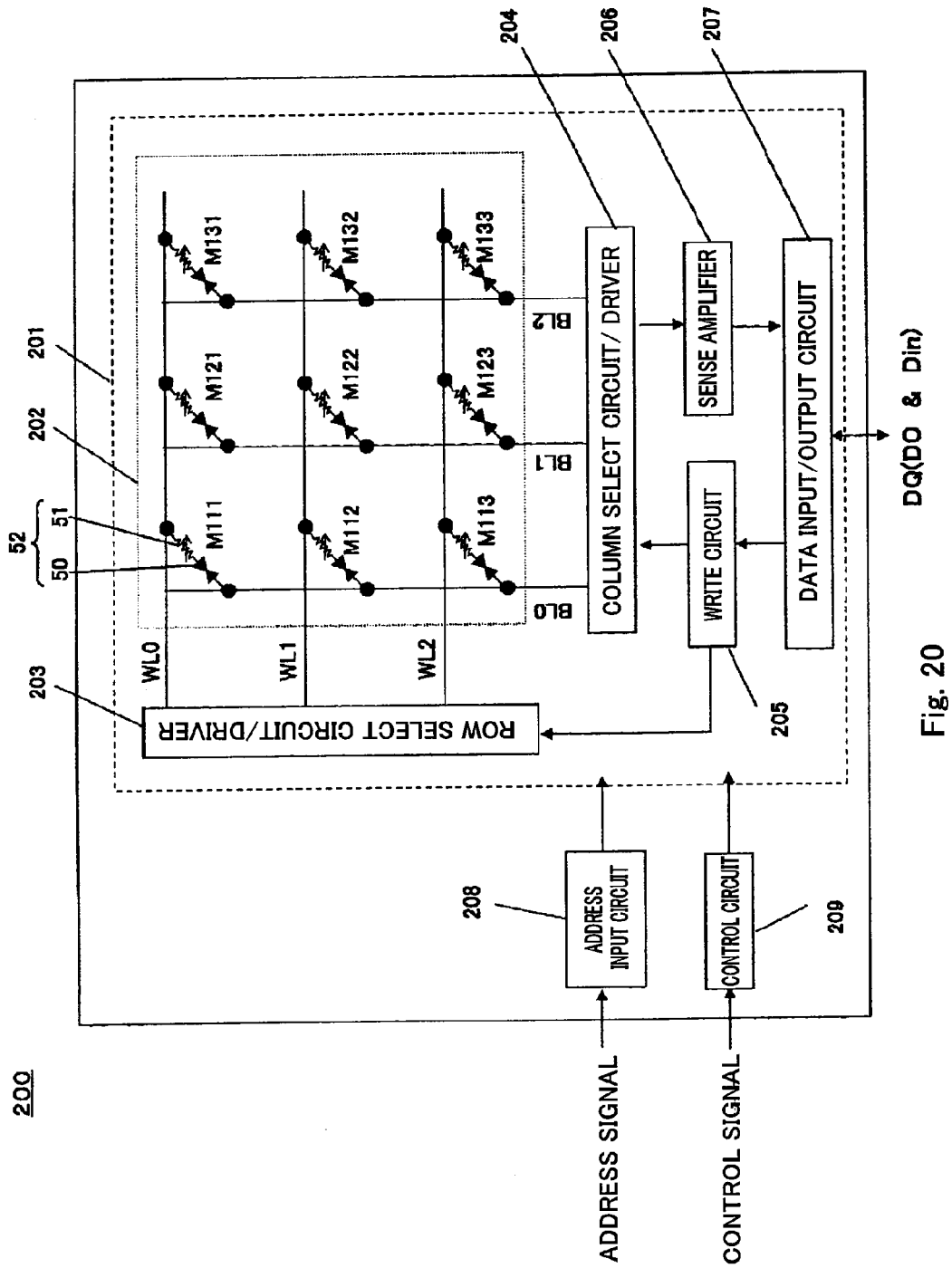
FIG. 20 is a block diagram showing a configuration of a memory device according to Embodiment 3 of the present invention.

FIG. 20 is a block diagram showing a configuration of a memory device according to Embodiment 3 of the present invention. The memory device 200 of this embodiment is configured to include a memory device similar to the memory devices 20 and 40 described in Embodiment 2 and is a cross-point memory device in which memory elements (memory cells) are arranged at cross points where word lines and bit lines three-dimensionally cross each other.

As shown in FIG. 20, the memory device 200 includes a memory main section 201. The memory main section 201 includes a memory array 202, a row select circuit/driver 203, a column select circuit/driver 204, a write circuit 205 for writing data, a sense amplifier 206 for amplifying a potential of the bit line and a data input/output circuit 207 which executes input/output processing of input/output data via a terminal DQ. The memory device 200 further includes an address input circuit 208 which receives an address signal externally input, and a control circuit 209 for controlling the operation of the memory main section 201, based on a control signal externally input.

The memory array 202 has a structure in which memory elements described in Embodiment 1 and Embodiment 2 are arranged in matrix as memory cells. The memory array 202 includes plural word lines WL0, WL1, WL2, which are formed on a semiconductor substrate to extend in parallel with each other, and plural bit lines BL0, BL1, BL2, which are formed above the plural word lines WL0, WL1, WL2, so as to extend in parallel with each other within a plane parallel to a main surface of the semiconductor substrate and so as to three-dimensionally cross the plural word lines WL0, WL1, WL2.

Further, plural memory elements M111, M112, M113, M121, M122, M123, M131, M132, M133, (hereinafter expressed as "memory elements M111, MC112, . . . ") are arranged in matrix so as to respectively correspond to the three-dimensional cross points of the plural word lines WL0, WL1, W12, and the plural bit lines BL0, BL1, BL2.

The memory elements M111, M112, . . . correspond to the memory elements according to Embodiment 2. Each of the memory elements includes a resistance variable element having the resistance variable layer comprising tantalum oxide on the semiconductor substrate, and a current rectifying element which is bidirectional, has a large ON/OFF current ratio, and is stacked on the resistance variable element.

The address input circuit 208 receives an address signal from an external circuit (not shown), and outputs a row address signal and a column address signal to the row select circuit/driver 203 and to the column select circuit/driver 204, respectively, based on the address signal. The address signal is a signal indicating the address of a specified memory cell to be selected from among the plural memory cells M111, M112, . . . . The row address signal is a signal indicating a row address in the address indicated by the address signal, and the column address signal is a signal indicating a column address in the address indicated by the address signal.

In a write cycle of data, the control circuit 209 outputs to the write circuit 205, a write signal for causing application of a write voltage, according to the input data Din input to the data input/output circuit 207. In a read cycle of data, the control circuit 209 outputs to the column select circuit/driver 204, a read signal for causing application of a read voltage.

The row select circuit/driver 203 receives the row address signal output from the address input circuit 208, selects one from among the plural word lines WL0, WL1, WL2, based on the row address signal and applies a predetermined voltage to the selected word line.

The column select circuit/driver 204 receives a column address signal output from the address input circuit 208, selects one from among the plural bit lines BL0, BL1, BL2, based on the column address signal and applies the write voltage or the read voltage to the selected bit line.

Receiving the write signal output from the control circuit 209, the write circuit 205 outputs to the row select circuit/driver 203, a signal for causing application of a voltage to the selected word line, and outputs to the column select circuit/driver 204 a signal for causing application of a write voltage to the selected bit line.

In the read cycle of data, the sense amplifier 206 amplifies the potential of a bit line which is a read target. The resulting output data DO is output to the external circuit via the data input/output circuit 207.

Therefore, writing and reading for the memory elements M111, M112, . . . in which the current rectifying element 50 and the resistance variable element 51 forming the memory element 52 as the memory cell are connected to each other in series are performed as in Embodiment 2. To be specific, when writing data, the current rectifying element 50 is applied with a high voltage and is in an ON-state, and a high voltage is efficiently applied to the resistance variable element 51. Therefore, stable writing to the memory element 111 or the like is performed. When reading data, the current rectifying element 50 is applied with a low voltage and is in an OFF-state, and a relatively low voltage is applied to the resistance variable element 51. Therefore, write disturb can be efficiently prevented. Furthermore, since the current rectifying element 50 is capable of efficiently preventing influence of a noise or crosstalk on the resistance variable element 51, an incorrect operation of the memory element M111 or the like can be prevented.

The memory device 200 can be fabricated by the fabrication method of the memory device according to Embodiment 2.

As should be appreciated from the above, since the memory device 200 can be configured to include the current rectifying element and the memory device illustrated in Embodiments 1 and 2 of the present invention, the current rectifying element having a bidirectional and non-linear voltage-current characteristic with respect to an applied voltage and a large ON/OFF current ratio may be used. Thus, the memory device 200 of this embodiment is fabricated as the highly-reliable memory device which is operable bidirectionally and stably without write disturb due to a bypass current from adjacent memory cells and without influence of a noise or crosstalk.

Embodiment 4

In Embodiment 2, the memory device 20 including as the memory cells the memory elements each including resistance variable element positioned close to the substrate and the current rectifying element connected in series to the resistance variable element has been described. On the other hand, in this embodiment, a memory device including as memory cells memory elements each including the current rectifying element positioned close to the substrate and the resistance variable element connected in series to the current rectifying element can be fabricated and operate similarly to the memory device 20 in Embodiment 2, which will be respectively described.

Figure 21:
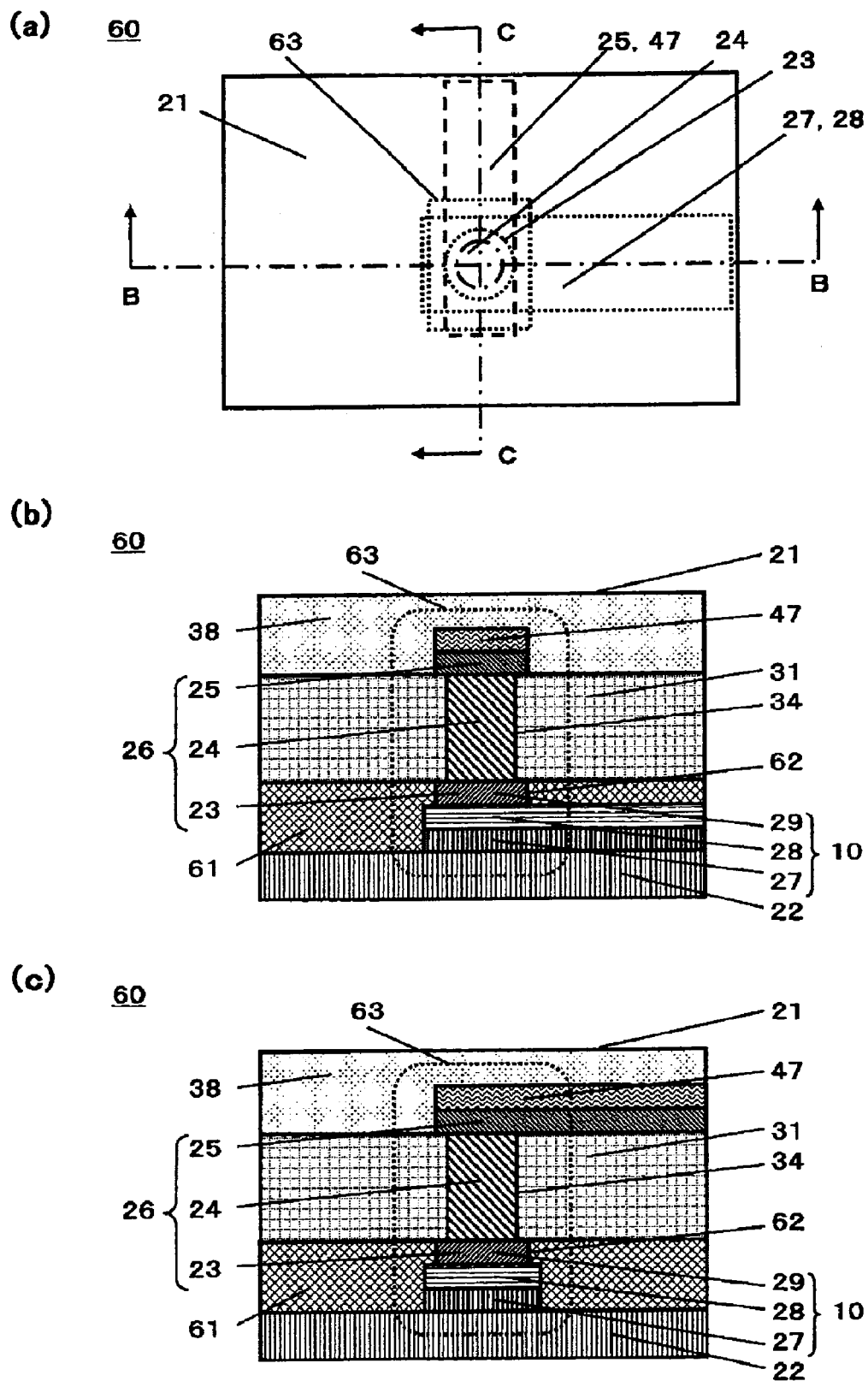

FIG. 21 is a view showing a schematic configuration of a memory device 60 according to Embodiment 4 of the present invention, in which FIG. 21(a) is a schematic view showing the configuration of the memory device 60 as viewed from the semiconductor chip surface 21, FIG. 21(b) is a schematic cross-sectional view taken in the direction of arrows along line B-B of FIG. 21(a) and FIG. 21(c) is a schematic cross-sectional view taken in the direction of arrows along line C-C of FIG. 21(a).

This Embodiment is different from the memory devices 20 and 40 illustrated in Embodiment 2 and Embodiment 3 in that the resistance variable element 26 is stacked on the current rectifying element 10. To be specific, as shown in FIGS. 21(a), 21(b) and 21(c), the resistance variable layer 24 is sandwiched between the lower electrode 23 and the upper electrode 25 on the upper side of the current rectifying element 10.

As shown in FIGS. 21(b) and 21(c), the memory device 60 includes on the substrate 22, the resistance variable element 26 in which the resistance variable layer 24 made of metal oxide material is sandwiched between the upper electrode 25 and the lower electrode 23 and the current rectifying element 10 which is connected to the lower side of the resistance variable element 26 and in which the barrier layer 28 is sandwiched between the first electrode layer 27 as a lower side and the second electrode layer 29 as an upper side. In accordance with such a configuration, as in the memory devices 20 and 40 in which the current rectifying element 10 and the resistance variable element 26 are connected in series in the stacking direction, the current rectifying element 10 connected in series to the lower side of the resistance variable element 26 in the stacking direction is capable of preventing write disturb in the resistance variable element 26 and capable of driving the resistance variable element 26 with a great current drivability. Since the memory device 60 of FIG. 21 configured in this manner operates similarly to the memory devices 20 and 40 described in Embodiment 2 and Embodiment 3, respectively, detailed description thereof is omitted. The memory device 60 includes a single memory element 63.

Next, the fabrication method of the memory device according to this embodiment will be described.

The fabrication method of the cross-point memory device 60 of this embodiment includes a step for forming the stripe-shaped first electrode layer 27 and the barrier layer 28 on the substrate 22, a step for forming a first interlayer insulating layer 61 on the substrate 22 including the first electrode layer 27 and the barrier layer 28 and then forming a first contact hole 62 in a portion of the lower interlayer insulating layer 61 on the barrier layer 28, and a step for forming the second electrode layer 29 inside the first contact hole 62 and on the first interlayer insulating layer 61. The fabrication method of the memory device 60 includes a step for removing a portion of the second electrode layer 29 on the first interlayer insulating layer 61 by the CMP technique, a step for forming a second interlayer insulating layer 31 on the second electrode layer 29 and on the first interlayer insulating layer 61, and a step for forming a second contact hole 34 which penetrates through the second interlayer insulating layer 31 on the second electrode layer 29 and exposes the second electrode layer 29. The fabrication method of the memory device 60 further includes a step for embedding the resistance variable layer 24 into the contact hole 34 and a step for forming the upper electrode 25 on the second interlayer insulating layer 31 such that the upper electrode 25 covers the resistance variable layer 24 and crosses the first electrode layer 27 in stripe shape.

The current rectifying element 10 having a structure in which the barrier layer 28 is sandwiched between the first electrode layer 27 and the second electrode layer 29 is electrically connected in series to the resistance variable element 26 in which the resistance variable layer 24 is sandwiched between the lower electrode 23 and the upper electrode 25. As shown in FIGS. 21(b) and 21(c), the second electrode 29 of the current rectifying element 10 and the lower electrode 23 of the resistance variable element 26 are formed as a common and integral electrode.

In the fabrication method of the memory device 60, the barrier layer 28 of the current rectifying element 10 is formed such that the element content of the material of the center region in the thickness direction sandwiched between the first electrode layer 27 and the second electrode layer 29 is different from the element content of the material of the region in the vicinity of the interface between the barrier layer 28 and each of the first electrode layer 27 and the second electrode layer 29 so that the barrier height of the material of the center region is larger than the barrier height of the material of the region in the vicinity of the interface.

With such a method, it is possible to fabricate a highly reliable memory device which is operable bidirectionally and stably without write disturb due to a bypass current from adjacent memory cells and without influence of a noise or crosstalk using a mass-production process which is compatible with a semiconductor process adapted for miniaturization.

Figure 22:
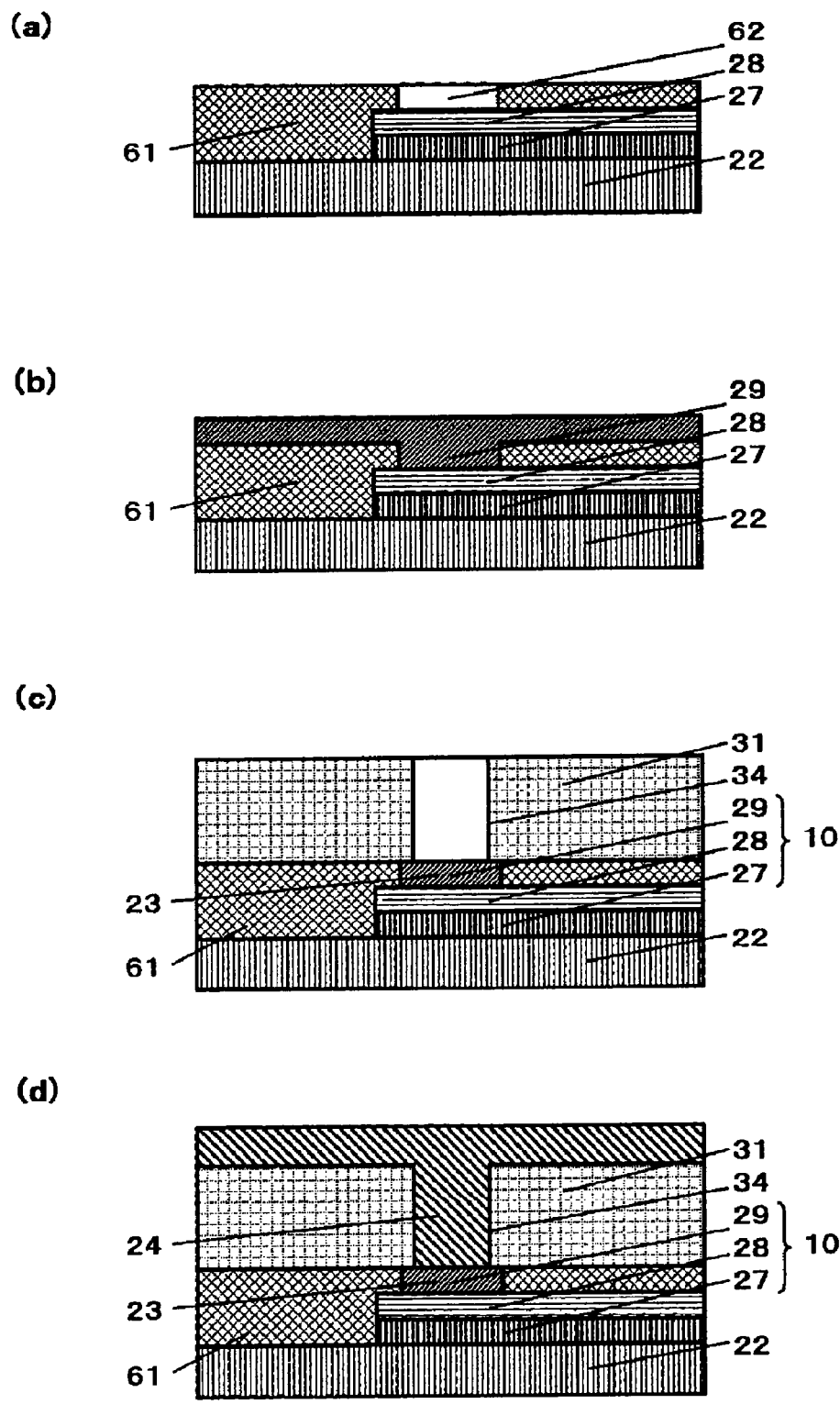
FIGS. 22(a) to 22(d) are schematic cross-sectional views showing a fabrication method (process flow of an earlier-half part) of a memory device according to Embodiment 4 of the present invention.
Figure 23:
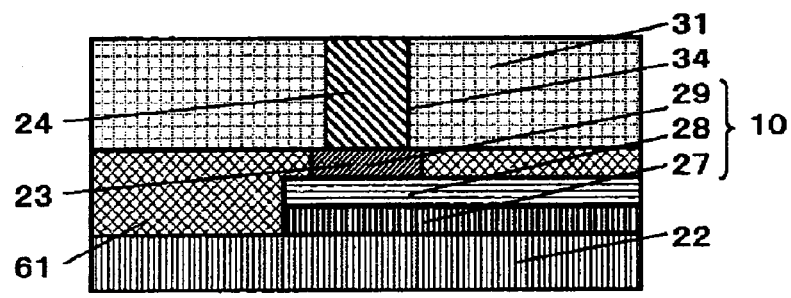
FIGS. 23(a) to 23(c) are schematic cross-sectional views showing a fabrication method (process flow of a later-half part) of the memory device according to Embodiment 4 of the present invention.
Figure 23:
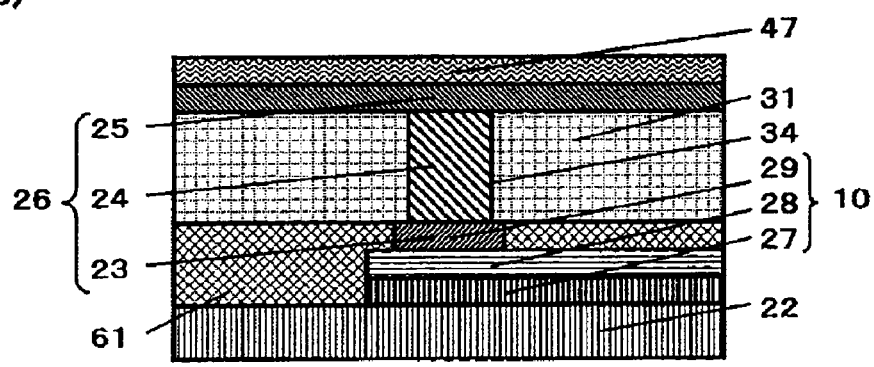
Figure 23:
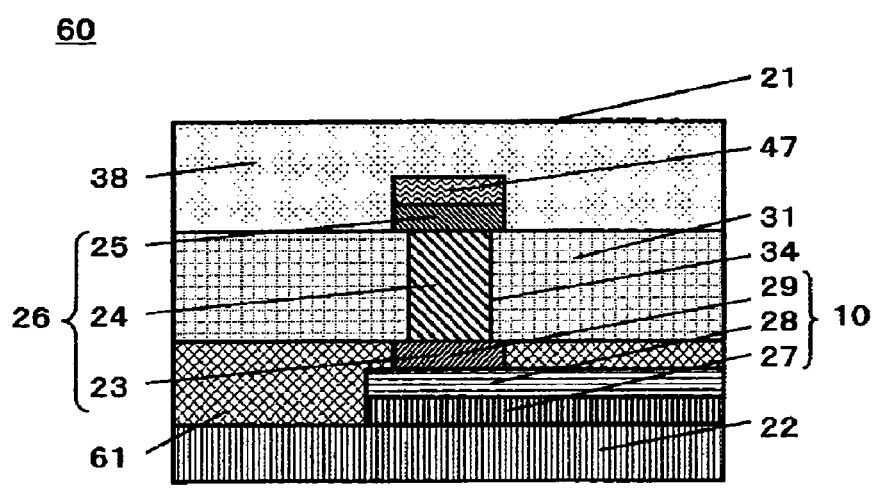

Next, a process flow of the fabrication method of the memory device 60 of this embodiment, will be described in sequence with reference to FIGS. 22 and 23. FIGS. 22 and 23 show a series of process flow. FIG. 22 shows a earlier-half process flow and FIG. 23 shows a later-half process flow.

As shown in FIG. 22(a), for example, the first electrode layer 27 made of Al is formed on the Si substrate 22, and for example, the barrier layer 28 formed of a SiN layer is stacked thereon by controlling the $N_2$ gas flow ratio in a reactive sputtering process, so as to extend with a 0.1 μm width in a specified direction by an etching process. The SiN layer includes three layers of $SiN_{x1}$—$SiN_{x2}$—$SiN_{x1}$ (X1<X2) in which the N content is larger in the center region layer than in other two layers in the three layers as illustrated in Embodiment 1. Then, a 0.3 μm-thick oxide layer is deposited as the lower interlayer insulating layer 61 by a CVD process or the like so as to cover the substrate 22, the first electrode layer 27 and the barrier layer 28. Then, the surface of the lower interlayer insulating layer 61 is planarized. Then, as shown in FIG. 22(a), in a step for forming the lower contact hole 62, the lower contact hole 62 of 90 nm in diameter is formed on the barrier layer 28 by, for example, a dry etching process, so as to penetrate through the lower interlayer insulating layer 61.

Then, as shown in FIG. 22(b), the second electrode layer 29 made of TaN is embedded in the lower contact hole 62 and is deposited on the lower interlayer insulating layer 61, by, for example, the CVD process or the like. Then, using the CMP (chemical mechanical polishing) technique, the second electrode layer 29 on the lower interlayer insulating layer 61 is removed so as to leave only a portion of the second electrode layer 29 embedded in the lower contact hole 62 for the purpose planarizing. Then, as shown in FIG. 22(c), an oxide layer is formed as the first interlayer insulating layer 31 so as to cover the lower interlayer insulating layer 61 and the second electrode layer 29 by the CVD process or the like, and then, the contact hole 34 of a 80 nm diameter is formed on the second electrode layer 29 by, for example, a dry etching process, so as to penetrate through the first interlayer insulating layer 31. It should be noted that the second electrode layer 29 serves as the lower electrode 23 of the resistance variable element 26.

Then, as shown in FIG. 22(d), an oxide layer material of transition metal is filled into the contact hole 34 by the sputtering process, thereby forming the resistance variable layer 24 such that the resistance variable material made of, for example, a tantalum oxide such as TaO is embedded in the contact hole 34 and the resistance variable layer 24 is deposited on the first interlayer insulating layer 31.

Then, as shown in FIG. 23(a), the resistance variable layer 24 deposited on the first interlayer insulating layer 31 is removed by CMP (chemical mechanical polishing) technique so as to expose the surface of the first interlayer insulating layer 31, leaving only a portion of the resistance variable layer 24 deposited in the contact hole 34. Then, as shown in FIG. 23(b), Al is deposited on the first interlayer insulating layer 31 so as to cover the resistance variable layer 24 by, for example, a sputtering process, forming a 0.1 µm-thick layer of the upper electrode 25. Then, a 0.1 µm-thick metal wire layer 47 made of Cu is deposited on the upper electrode 25.

Then, as shown in FIG. 23(c), 90 nm-thick upper electrode 25 and 90 nm-thick metal wire layer 47 are formed so as to cover the resistance variable layer 24 by an etching process, and then, a fluorine-doped oxide layer is deposited as a second interlayer insulating layer 38 on the first interlayer insulating layer 31 so as to cover the upper electrode 25 and the metal wire layer 47, by, for example, the CVD process.

Through the above mentioned process flow, the memory device 60 is fabricated. The fabrication process illustrated in this embodiment uses a mask process identical to, for example, a semiconductor planar process such as the CMOS process adapted for miniaturization and does not use a special semiconductor process peculiar to this embodiment in fabrication of the resistance variable layer 24 and the barrier layer 28. Therefore, it is possible to fabricate the resistance variable layer 24 with a method which is compatible with a semiconductor process adapted for further miniaturization and with a minimum size of a process rule of a process used, for example, a process rule less than 100 nm. It should be noted that the metal wire layer 47 is formed on the upper electrode 25 to further increase a speed of the memory device 60 and substantially further reduces the resistance value of the upper electrode 25. Therefore, when a further increase in the speed is unnecessary, the metal wire layer 47 may be omitted.

Although the memory device 60 of FIG. 21 includes the single memory element 63, the memory device of this embodiment may be fabricated as a memory device having a configuration similar to those shown in FIGS. 16 and 17 illustrated in Embodiment 2 in which the plural memory elements 63 are arranged in matrix as the memory cells.

By fabricating the memory device with the above configuration, it is possible to fabricate a highly-reliable memory device which is operable bidirectionally and stably without write disturb due to a bypass current from adjacent memory cells and without influence of a noise or crosstalk using a mass-production process which is compatible with a semiconductor process adapted for miniaturization.

In the fabrication method, the barrier layer may be formed such that the element content of the material of the center region is different from the element content of the material of the region in the vicinity of the interface so that a difference in barrier height between the center region and the region in the vicinity of the interface is 20 meV or larger. With such a method, it is possible to fabricate a memory device incorporating the current rectifying element having a bidirectional and non-linear voltage-current characteristic with respect to an applied voltage and having a larger ON/OFF current ratio. It is possible to fabricate a memory device including the resistance variable element using the resistance variable layer and the bidirectional current rectifying element which is most suitable as, for example, the current rectifying element connected in series to the resistance variable element.

In the fabrication method, the barrier layer may be formed such that the element content of the material of the center region is different from the element content of the material of the region in the vicinity of the interface so that a difference in barrier height between the center region and the region in the vicinity of the interface is 20 meV or larger and 220 meV or smaller. In such a configuration, since the ON/OFF current ratio of the current rectifying element can be made maximum within a range of the voltage applied for a write operation and a read operation of the memory cell, it is possible to achieve a highly reliable memory device which operates stably without write disturb due to a bypass current from adjacent memory cells and without influence of a noise or crosstalk. The memory device can be fabricated using a mass-production process which is compatible with a semiconductor process adapted for miniaturization.

In the fabrication method, the barrier layer may be formed to have a composition profile in which the content of one of nitrogen, carbon and oxygen is higher in the center region than in the region in the vicinity of the interface in the stacking direction. The profile of the element content may be such that the content increases in the center region continuously, or in a stepwise manner. With such a method, it is possible to fabricate a highly reliable memory device which is operable stably without write disturb due to a bypass current from adjacent memory cells and without influence of a noise or crosstalk using a mass-production process which is compatible with a semiconductor process adapted for miniaturization.

In the fabrication method, the barrier layer may be formed to have a multi-layer structure including at least three layers in which the content of one of nitrogen, carbon and oxygen is different, and have a composition profile in which the contents of nitrogen, carbon, and oxygen increase in height in a stepwise manner from the region in the vicinity of the interface to the center region in the stacking direction. With such a method, it is possible to fabricate a highly reliable memory device which is operable stably without write disturb due to a bypass current from adjacent memory cells and without influence of a noise or crosstalk using a mass-production process which is compatible with a semiconductor process adapted for miniaturization.

At least one layer of the first electrode layer and the second electrode layer may be at least one layer selected from among TiAlN, TiN, TaN, TaAlN, and TaSiN.

Embodiment 5

Figure 24:
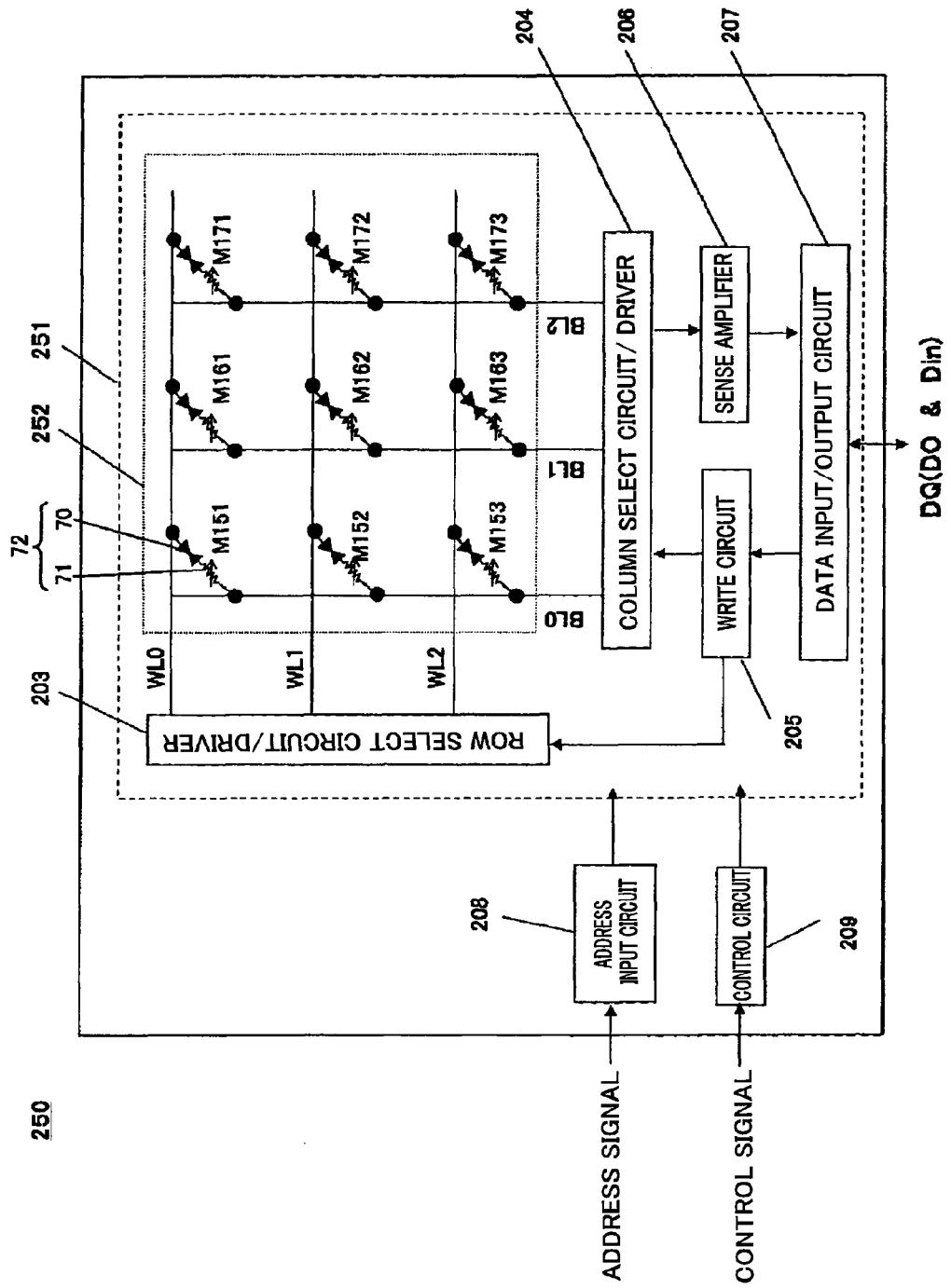
FIG. 24 is a block diagram showing a configuration of a memory device according to Embodiment 5 of the present invention.

FIG. 24 is a block diagram showing a configuration of a memory device according to Embodiment 5 of the present invention. A memory device 250 of this embodiment is configured similarly to the memory device 200 described in Embodiment 3 and is a cross-point memory device in which memory elements (memory cells) identical to the memory elements 63 of the memory device 60 described in Embodiment 4 are arranged at cross points where word lines and bit lines three-dimensionally cross each other. The memory device 250 of FIG. 24 is different from the memory device 200 of FIG. 20 in a memory array 252 of a memory main section 251, i.e., in the memory device 250, the connection relationship between a resistance variable element 71 and a current rectifying element 70 is reversed with respect to the connection relationship of the memory device 200. In other configuration, the memory device 250 is identical to the memory device 200, and therefore detailed description thereof is omitted.

Writing and reading for the memory elements M111, M112, . . . in which the current rectifying element 70 and the resistance variable element 71 forming the memory element 72 are connected in series are performed similarly to Embodiment 2. To be specific, when writing data, the current rectifying element 70 is applied with a high voltage and is in an ON-state, and a high voltage is efficiently applied to the resistance variable element 71. Therefore, stable writing to the memory element M111 or the like is performed. When reading data, the current restrict element 70 is applied with a low voltage and is in an OFF-state, and a relatively low voltage is applied to the resistance variable layer 71. Therefore, write disturb is efficiently prevented. Furthermore, since the current rectifying element 70 is capable of efficiently preventing influence of a noise or crosstalk on the resistance variable element 71, an incorrect operation of the memory element M111 or the like can be prevented.

The memory device 250 can be fabricated in the same manner by the fabrication method of the memory device of Embodiment 4.

As should be appreciated from the above, since the memory device 250 can be configured to include the current rectifying element and the memory device illustrated in Embodiments 1 and 4 of the present invention, the current rectifying element having a bidirectional and non-linear voltage-current characteristic with respect to the applied voltage and a large ON/OFF current ratio may be used. Thus, the memory device 250 of this embodiment is fabricated as a highly-reliable memory device which is operable bidirectionally and stably without write disturb due to a bypass current from adjacent memory cells and without influence of a noise or crosstalk.

In such a configuration, it is possible to fabricate a crosspoint memory device which has high-dense integration and is highly practical, by a mass production process which is compatible with a process which is adapted for miniaturization and is mainly based on a process rule less than 100 nm. Since the current rectifying element is connected to the lower side of the resistance variable element to achieve a higher current drivability, the resistance variable element is capable of stably repeating resistance switching.

Although the resistance variable element is connected in series to the current rectifying element in the memory elements illustrated in Embodiment 2 to Embodiment 5, which of the resistance variable element and the current rectifying element should be positioned at the upper side in the stacking direction may be determined as desired. In either case, the above-described advantage is achieved in the same manner.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

The present invention provides a current rectifying element having a bidirectional and non-linear voltage-current characteristic with respect to an applied voltage and a large ON-OFF current ratio, a memory device incorporating a memory element using the current rectifying element and a fabrication method thereof. Therefore, the present invention is widely applicable to circuit boards or devices such as portable information devices and information home appliances.

The invention claimed is:

1. A current rectifying element including a barrier layer, a first electrode layer and a second electrode layer, the barrier layer being sandwiched between the first electrode layer and the second electrode layer;
   wherein the barrier layer includes an element A (A is nitrogen, carbon, or oxygen) and silicon;
   wherein the barrier layer is configured such that a content ratio of the element A to silicon is larger in a center region in a thickness direction thereof than in a region in the vicinity of an interface between the first electrode layer and the barrier layer and in a region in the vicinity of an interface between the second electrode layer and the barrier layer;
   wherein the barrier layer has a barrier height which is larger in the center region in the thickness direction than in the region in the vicinity of the interface between the first electrode layer and the barrier layer and in the region in the vicinity of the interface between the second electrode layer and the barrier layer, and
   wherein the center region in a thickness direction contains silicon.

2. The current rectifying element according to claim 1, wherein a difference between the barrier height of the center region and the barrier height of the region in the vicinity of the interface is 20 meV or larger.

3. The current rectifying element according to claim 1, wherein a difference between the barrier height of the center region and the barrier height of the region in the vicinity of the interface is 20 eV or larger and 220 meV or smaller.

4. The current rectifying element according to any one of claims 1 to 3, wherein the barrier layer is made of a semiconductor material or an insulator material.

5. The current rectifying element according to claim 1, wherein a content of at least one of nitrogen, carbon, and oxygen increases continuously from the region in the vicinity of the interface to the center region in the thickness direction.

6. The current rectifying element according to claim 1, wherein the barrier layer has a multi-layer structure including at least three layers in which a content of at least one of nitrogen, carbon, and oxygen is different;
   and wherein the content of at least one of nitrogen, carbon, and oxygen increases in a stepwise manner from the region in the vicinity of the interface to the center region in a stacking direction.

7. The current rectifying element according to claim 1, wherein a ratio of a content of nitrogen in the center region to a content of nitrogen in the region in the vicinity of the interface is 0.03 or larger.

8. The current rectifying element according to claim 1, wherein a ratio of a content of nitrogen in the center region to a content of nitrogen in the region in the vicinity of the interface is 0.03 or larger and 0.31 or smaller.

9. A memory device comprising:
   a memory element including a lower electrode formed on a substrate, an upper electrode, and a resistance variable layer sandwiched between the lower electrode and the upper electrode;
   the current rectifying element according to claim 1; and
   an interlayer insulating layer formed on the substrate so as to cover the memory element and the current rectifying element; wherein the current rectifying element is electrically connected in series to an upper side or a lower side of the memory element.

10. A memory device comprising:
a memory element including a lower electrode formed on a substrate, an upper electrode, and a resistance variable layer sandwiched between the lower electrode and the upper electrode;
the current rectifying element according to claim 1; and
an interlayer insulating layer formed on the substrate so as to cover the memory element and the current rectifying element;
wherein the lower electrode is formed on the substrate in a stripe shape;
wherein the second electrode layer is formed in a stripe shape so as to cross the lower electrode; and
wherein the current rectifying element is electrically connected in series to an upper side or a lower side of the memory element; and the memory element includes the resistance variable layer and the current rectifying element which are provided at a cross portion where the lower electrode and the second electrode layer cross each other.

11. The memory device according to claim 9 or 10, wherein the resistance variable layer is configured to perform a memory operation such that the resistance variable layer switches to a low-resistance state in response to a positive voltage applied and to a high-resistance state in response to a negative voltage applied, or switches to the high-resistance state in response to the positive voltage applied and to the low-resistance state in response to the negative voltage applied.

12. The memory device according to claim 9 or 10, wherein the resistance variable layer includes at least a tantalum oxide, and a resistance value of the resistance variable layer is switchable reversibly in response to an electrical signal applied between the lower electrode and the second electrode layer.

13. The memory device according to claim 11, wherein the current rectifying element is configured to perform an operation for restricting a current in a low-voltage range bidirectionally in response to an electrical signal applied between the lower electrode and the second electrode layer.

14. The memory device according to claim 12, wherein the current rectifying element is configured to perform an operation for restricting a current in a low-voltage range bidirectionally in response to an electrical signal applied between the lower electrode and the second electrode layer.

* * * * *

UNITED STATES PATENT AND TRADEMARK OFFICE
CERTIFICATE OF CORRECTION

PATENT NO. : 8,295,123 B2
APPLICATION NO. : 12/669174
DATED : October 23, 2012
INVENTOR(S) : Takeshi Takagi et al.

It is certified that error appears in the above-identified patent and that said Letters Patent is hereby corrected as shown below:

In the Claims:

At column 34, claim number 3, line number 35, "20 eV" should read "20meV".

Signed and Sealed this
Fourteenth Day of May, 2013

Teresa Stanek Rea
*Acting Director of the United States Patent and Trademark Office*